United States Patent
Cok

(10) Patent No.: US 11,061,276 B2
(45) Date of Patent: Jul. 13, 2021

(54) LASER ARRAY DISPLAY

(71) Applicant: X Display Company Technology Limited, Dublin (IE)

(72) Inventor: Ronald S. Cok, Rochester, NY (US)

(73) Assignee: X Display Company Technology Limited, Dublin (IE)

(*) Notice: Subject to any disclaimer, the term of this patent is extended or adjusted under 35 U.S.C. 154(b) by 109 days.

(21) Appl. No.: 14/934,838

(22) Filed: Nov. 6, 2015

(65) Prior Publication Data

US 2017/0133818 A1 May 11, 2017

(51) Int. Cl.
| | | |
|---|---|---|
| *H01S 5/00* | (2006.01) |
| *G02B 5/00* | (2006.01) |
| *G02B 3/00* | (2006.01) |
| *G02B 5/02* | (2006.01) |
| *G02B 27/48* | (2006.01) |
| *G02F 1/13357* | (2006.01) |
| *G09F 9/33* | (2006.01) |

(Continued)

(52) U.S. Cl.
CPC ..... *G02F 1/133606* (2013.01); *G02B 3/0006* (2013.01); *G02B 5/003* (2013.01); *G02B 5/0242* (2013.01); *G02B 27/48* (2013.01); *G02F 1/133603* (2013.01); *G09F 9/33* (2013.01); *G02F 1/133607* (2021.01); *H01L 25/0753* (2013.01); *H01L 33/20* (2013.01); *H01S 5/423* (2013.01)

(58) Field of Classification Search
CPC . H01L 25/167; H01L 27/156; H01L 25/0753; H01L 25/0756; H01L 51/5262; H01L 51/0013; H04N 9/3152; H04N 9/3155; H04N 9/3161; G03B 21/2033; G02B 6/0068; G02B 6/0073; G02B 27/48; G02B 3/0006; G02B 5/003; G02B 5/0242; G02F 1/133606; G02F 2001/133607; G09F 9/33
See application file for complete search history.

(56) References Cited

U.S. PATENT DOCUMENTS

| | | | |
|---|---|---|---|
| 4,746,202 A | 5/1988 | Perilloux et al. |
| 5,060,027 A | 10/1991 | Hart et al. |

(Continued)

FOREIGN PATENT DOCUMENTS

| | | |
|---|---|---|
| CN | 103677427 A | 3/2014 |
| EP | 1662301 A1 | 5/2006 |

(Continued)

OTHER PUBLICATIONS

U.S. Appl. No. 14/822,868, Bower et al.

(Continued)

*Primary Examiner* — Ephrem Z Mebrahtu
(74) *Attorney, Agent, or Firm* — William R. Haulbrook; Michael D. Schmitt; Choate, Hall & Stewart LLP

(57) ABSTRACT

A micro-LED laser display having an array of display pixels includes a display substrate for displaying an image and an array of display pixels. Each display pixel has one or more micro-LED lasers disposed on the display substrate. Each micro-LED laser emits light within an emission angle. One or more light spreaders for increasing the emission angle of light emitted by each micro-LED laser are disposed in relation to the light spreaders and a controller individually controls the micro-LED lasers.

22 Claims, 17 Drawing Sheets

(51) Int. Cl.
  *H01S 5/42* (2006.01)
  *H01L 25/075* (2006.01)
  *H01L 33/20* (2010.01)
  *G02F 1/1335* (2006.01)

(56) References Cited

U.S. PATENT DOCUMENTS

| | | |
|---|---|---|
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |
| 5,815,303 A | 9/1998 | Berlin |
| 5,825,047 A | 10/1998 | Ajisawa et al. |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 * | 9/2001 | Kastalsky ............ G02B 5/1828 359/254 |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,464,366 B1 * | 10/2002 | Lin .................... G02B 6/0033 358/484 |
| 6,466,281 B1 | 10/2002 | Huang et al. |
| 6,504,180 B1 | 1/2003 | Heremans et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,879,014 B2 | 4/2005 | Wagner et al. |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,329,905 B2 | 2/2008 | Ibbetson et al. |
| 7,354,801 B2 | 4/2008 | Sugiyama et al. |
| 7,402,951 B2 | 7/2008 | Cok |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,558,243 B2 | 10/2013 | Bibl et al. |
| 8,581,827 B2 | 11/2013 | Park et al. |
| 8,596,846 B2 | 12/2013 | Yankov et al. |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,836,624 B2 | 9/2014 | Roberts et al. |
| 8,854,294 B2 | 10/2014 | Sakariya |
| 8,860,051 B2 | 10/2014 | Fellows et al. |
| 8,865,489 B2 | 10/2014 | Rogers et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,912,020 B2 | 12/2014 | Bedell et al. |
| 8,941,215 B2 | 1/2015 | Hu et al. |
| 8,946,760 B2 | 2/2015 | Kim |
| 8,987,765 B2 | 3/2015 | Bibl et al. |
| 9,048,449 B2 | 6/2015 | Kim et al. |
| 9,105,714 B2 | 8/2015 | Hu et al. |
| 9,105,813 B1 | 8/2015 | Chang |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,166,114 B2 | 10/2015 | Hu et al. |
| 9,178,123 B2 | 11/2015 | Sakariya et al. |
| 9,202,996 B2 | 12/2015 | Orsley et al. |
| 9,217,541 B2 | 12/2015 | Bathurst et al. |
| 9,226,361 B2 | 12/2015 | Toth |
| 9,240,397 B2 | 1/2016 | Bibl et al. |
| 9,252,375 B2 | 2/2016 | Bibl et al. |
| 9,277,618 B2 | 3/2016 | Odnoblyudov et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,358,775 B2 | 6/2016 | Bower et al. |
| 9,367,094 B2 | 6/2016 | Bibl et al. |
| 9,368,683 B1 | 6/2016 | Meitl et al. |
| 9,391,239 B2 | 7/2016 | Tsai et al. |
| 9,412,727 B2 | 8/2016 | Menard et al. |

(56) References Cited

U.S. PATENT DOCUMENTS

| | | |
|---|---|---|
| 9,412,977 B2 | 8/2016 | Rohatgi |
| 9,437,782 B2 | 9/2016 | Bower et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,537,069 B1 | 1/2017 | Bower et al. |
| 9,555,644 B2 | 1/2017 | Rogers et al. |
| 9,583,533 B2 | 2/2017 | Hu et al. |
| 9,626,908 B2 | 4/2017 | Sakariya et al. |
| 9,640,715 B2 | 5/2017 | Bower et al. |
| 9,705,042 B2 | 7/2017 | Bower et al. |
| 9,741,785 B2 | 8/2017 | Bower et al. |
| 9,761,754 B2 | 9/2017 | Bower et al. |
| 9,765,934 B2 | 9/2017 | Rogers et al. |
| 9,860,955 B2 | 1/2018 | Kim et al. |
| 9,865,832 B2 | 1/2018 | Bibl et al. |
| 9,871,345 B2 | 1/2018 | Bower et al. |
| 9,929,053 B2 | 3/2018 | Bower et al. |
| 9,980,341 B2 | 5/2018 | Bower et al. |
| 9,991,163 B2 | 6/2018 | Bower et al. |
| 9,991,423 B2 | 6/2018 | Bower et al. |
| 9,997,501 B2 | 6/2018 | Bower et al. |
| 10,066,819 B2 | 9/2018 | Cok |
| 10,103,069 B2 | 10/2018 | Bower et al. |
| 10,153,256 B2 | 12/2018 | Cok et al. |
| 10,153,257 B2 | 12/2018 | Cok et al. |
| 10,164,404 B2 | 12/2018 | Bower et al. |
| 10,193,025 B2 | 1/2019 | Bower et al. |
| 10,199,546 B2 | 2/2019 | Cok et al. |
| 10,224,460 B2 | 3/2019 | Bower et al. |
| 10,230,048 B2 | 3/2019 | Bower et al. |
| 2001/0022564 A1 | 9/2001 | Youngquist et al. |
| 2002/0064032 A1 | 5/2002 | Oohata |
| 2002/0084952 A1* | 7/2002 | Morley ............... H01L 27/3211 345/32 |
| 2002/0096994 A1 | 7/2002 | Iwafuchi et al. |
| 2003/0117369 A1 | 6/2003 | Spitzer et al. |
| 2004/0080483 A1 | 4/2004 | Chosa |
| 2004/0080941 A1 | 4/2004 | Jiang et al. |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0082643 A1 | 4/2005 | Kondo |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0194606 A1 | 9/2005 | Oohata |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2008/0259241 A1* | 10/2008 | Morimoto ......... G02F 1/133603 349/62 |
| 2009/0045420 A1 | 2/2009 | Eng et al. |
| 2009/0140630 A1* | 6/2009 | Kijima ................ C09K 11/661 313/498 |
| 2009/0146921 A1 | 6/2009 | Takahashi |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0038655 A1* | 2/2010 | Chen ..................... H01L 33/08 257/88 |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0213819 A1 | 8/2010 | Cok et al. |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1* | 12/2010 | Rogers .................. H01L 33/486 438/27 |
| 2010/0321414 A1 | 12/2010 | Muroi et al. |
| 2010/0328268 A1 | 12/2010 | Teranishi et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2012/0018745 A1 | 1/2012 | Liu et al. |
| 2012/0049222 A1* | 3/2012 | Yoshizumi .......... H01L 25/0753 257/98 |
| 2012/0056835 A1 | 3/2012 | Choo et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0154713 A1* | 6/2012 | Kwon ................ G02F 1/133526 349/64 |
| 2012/0206428 A1 | 8/2012 | Cok |
| 2012/0206499 A1 | 8/2012 | Cok |
| 2012/0212465 A1 | 8/2012 | White et al. |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2012/0320581 A1* | 12/2012 | Rogers .................... H01L 24/24 362/235 |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1* | 2/2013 | Rogers .................... B41J 2/475 101/483 |
| 2013/0069275 A1 | 3/2013 | Menard et al. |
| 2013/0088416 A1 | 4/2013 | Smith et al. |
| 2013/0128585 A1 | 5/2013 | Bibl et al. |
| 2013/0153277 A1 | 6/2013 | Menard et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0249375 A1* | 9/2013 | Panagotacos ...... H05B 33/0803 313/13 |
| 2013/0257264 A1 | 10/2013 | Tamaki et al. |
| 2013/0273695 A1 | 10/2013 | Menard et al. |
| 2013/0278513 A1 | 10/2013 | Jang |
| 2013/0309792 A1 | 11/2013 | Tischler et al. |
| 2014/0014960 A1 | 1/2014 | Yamazaki et al. |
| 2014/0027709 A1 | 1/2014 | Higginson et al. |
| 2014/0082934 A1 | 3/2014 | Cok |
| 2014/0084240 A1 | 3/2014 | Hu et al. |
| 2014/0084482 A1 | 3/2014 | Hu et al. |

(56) References Cited

U.S. PATENT DOCUMENTS

| | | |
|---|---|---|
| 2014/0085214 A1 | 3/2014 | Cok |
| 2014/0094878 A1 | 4/2014 | Gossler et al. |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0159043 A1 | 6/2014 | Sakariya et al. |
| 2014/0159065 A1 | 6/2014 | Hu et al. |
| 2014/0159066 A1 | 6/2014 | Hu et al. |
| 2014/0168037 A1 | 6/2014 | Sakariya et al. |
| 2014/0175498 A1 | 6/2014 | Lai |
| 2014/0183446 A1 | 7/2014 | Nago et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0339495 A1 | 11/2014 | Bibl et al. |
| 2014/0340900 A1* | 11/2014 | Bathurst .......... F21K 9/00 362/249.02 |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0255438 A1 | 9/2015 | Oraw et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1* | 10/2015 | van de Ven .......... G09F 9/33 362/84 |
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0064363 A1 | 3/2016 | Bower et al. |
| 2016/0085120 A1 | 3/2016 | Xu |
| 2016/0131329 A1* | 5/2016 | Park .......... G02F 1/133603 362/97.1 |
| 2016/0260388 A1 | 9/2016 | Yata et al. |
| 2016/0266697 A1 | 9/2016 | Cheng et al. |
| 2016/0351539 A1 | 12/2016 | Bower et al. |
| 2016/0364030 A1 | 12/2016 | Peana et al. |
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250167 A1 | 8/2017 | Bower et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0352646 A1 | 12/2017 | Bower et al. |
| 2017/0357127 A1 | 12/2017 | Cok et al. |
| 2017/0358717 A1 | 12/2017 | Cok et al. |
| 2018/0033853 A1 | 2/2018 | Bower et al. |
| 2018/0041005 A1 | 2/2018 | Bower et al. |
| 2018/0084614 A1 | 3/2018 | Bower et al. |
| 2018/0119931 A1 | 5/2018 | Bower et al. |
| 2018/0130400 A1 | 5/2018 | Meitl et al. |
| 2018/0174932 A1 | 6/2018 | Cok et al. |
| 2018/0175248 A1 | 6/2018 | Ahmed |
| 2018/0211945 A1 | 7/2018 | Cok et al. |
| 2018/0226386 A1 | 8/2018 | Cok |
| 2018/0277525 A1 | 9/2018 | Cok et al. |
| 2018/0323180 A1 | 11/2018 | Cok |
| 2018/0366450 A1 | 12/2018 | Gardner et al. |
| 2019/0088630 A1 | 3/2019 | Cok et al. |
| 2019/0148604 A1 | 5/2019 | Cok et al. |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| JP | 2002-261335 A | 9/2002 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/011415 A1 | 1/2013 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/149067 A1 | 9/2017 |
| WO | WO-2017/174632 A1 | 10/2017 |

OTHER PUBLICATIONS

Johnson, K. et al., Advances in Red VCSEL Technology, Advances in Optical Technologies, 2012:569379, 13 pages (2012).

Kasahara, D. et al, Nichia reports first room-temperature blue/ 'green' VCSELs with current injection, Appl. Phys. Express, 4(7):3 pages (2011).

Roscher, H., VCSEL Arrays with Redundant Pixel Designs for 10Gbits/s 2-D Space-Parallel MMF Transmission, Annual Report, optoelectronics Department, (2005).

Seurin, J.F. et al, High-power red VCSEL arrays, Proc. of SPIE 8639:1-9 (2013).

Yaniv et al., A 640 × 480 Pixel Computer Display Using Pin Diodes with Device Redundancy, 1988 International Display Research Conference, IEEE, CH-2678-1/88:152-154 (1988).

Yoon, J. et al., Heterogeneously Integrated Optoelectronic Devices Enabled by MicroTransfer Printing, Adv. Optical Mater. 3:1313-1335 (2015).

U.S. Appl. No. 14/788,632, filed Jun. 30, 2015, X-Celeprint Limited.

U.S. Appl. No. 14/807,311, filed Jul. 23, 2015, X-Celeprint Limited.

U.S. Appl. No. 14/822,866, filed Aug. 10, 2015, Bower et al.

(56) References Cited

OTHER PUBLICATIONS

Choi, H. W. et al., Efficient GaN-based Micro-LED Arrays, Mat. Res. Soc. Symp. Proc. 743:L6.28.1-L6.28.6 (2003).

Cok, R. S. et al., AMOLED displays with transfer-printed integrated circuits, Journal of SID 19/(4):335-341(2011).

Hamer et al., "63.2: AMOLED Displays Using Transfer-Printed Integrated Circuits," SID 09 Digest, 40(2):947-950 (2009).

Koma, N. et al., 44.2: Novel Front-light System Using Fine-pitch Patterned OLED, SID, 08:655-658 (2008).

Lee, S. H. etal, Laser Lift-Off of GaN Thin Film and its Application to the Flexible Light Emitting Diodes, Proc. of SPIE 8460:846011-1-846011-6 (2012).

Poher, V. et al., Micro-LED arrays: a tool for two-dimensional neuron stimulation, J. Phys. D: Appl. Phys. 41:094014 (2008).

Matioli, E. et al., High-brightness polarized light-emitting diodes, Light: Science & Applications, 1:e22:1-7 (2012).

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

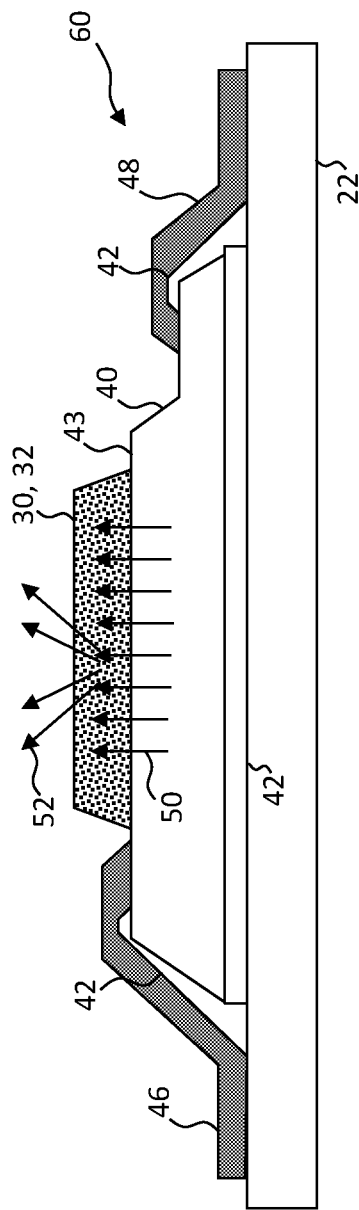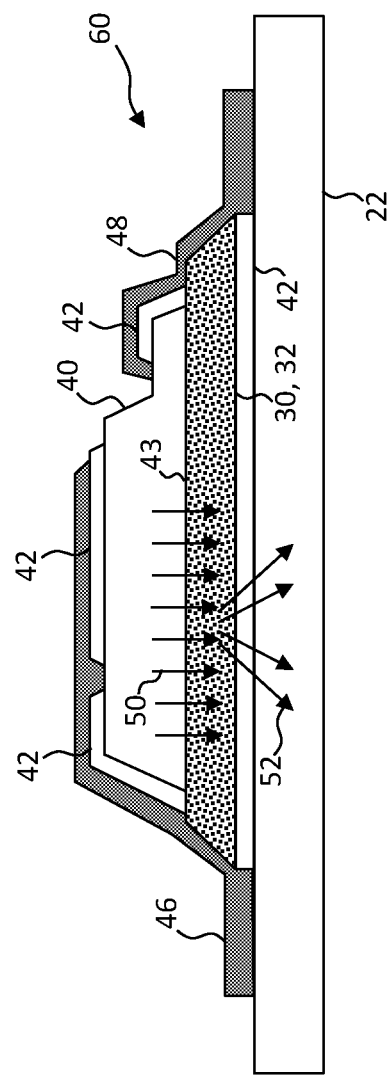

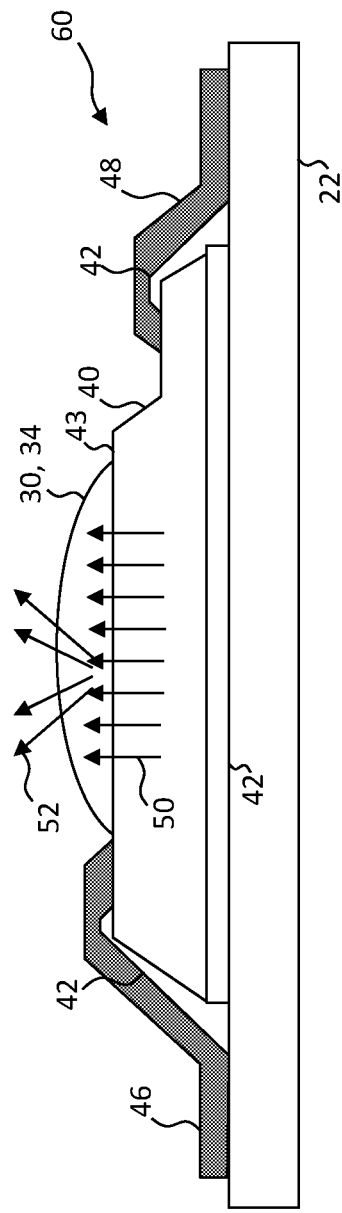

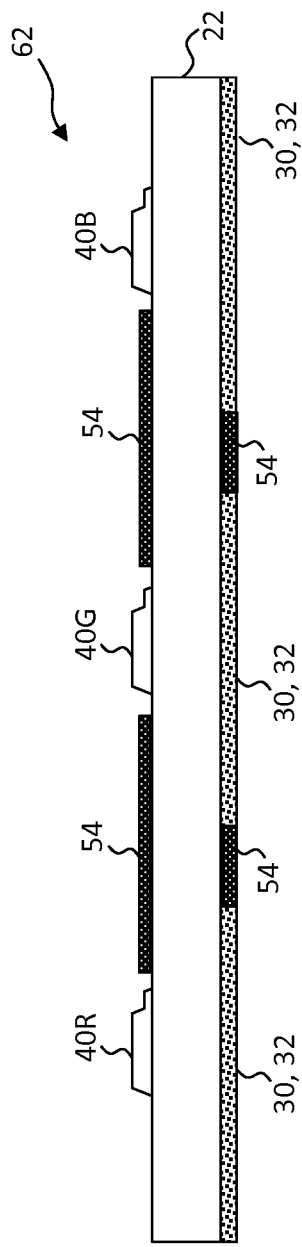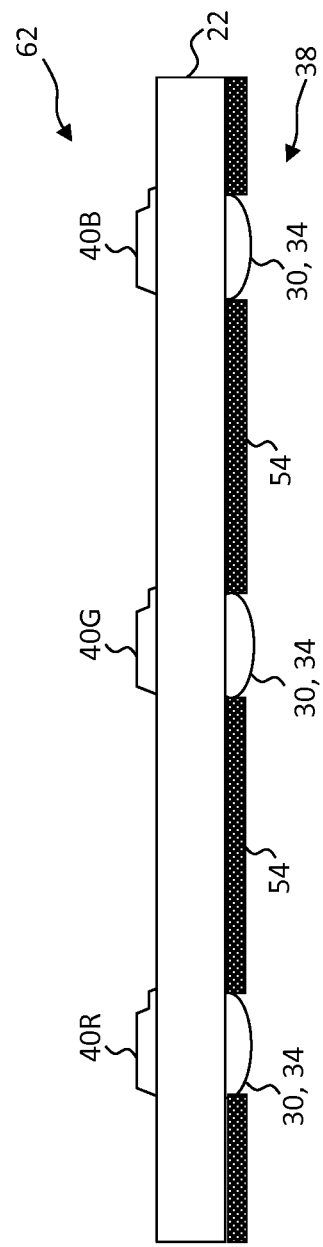

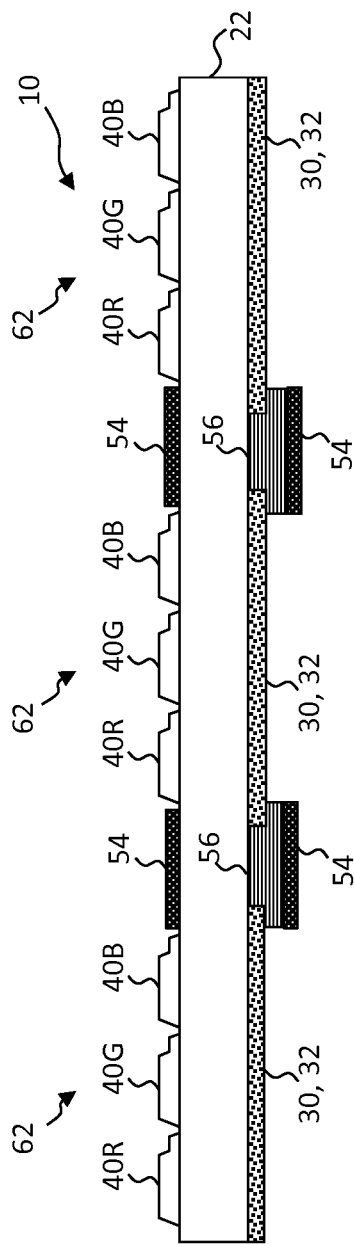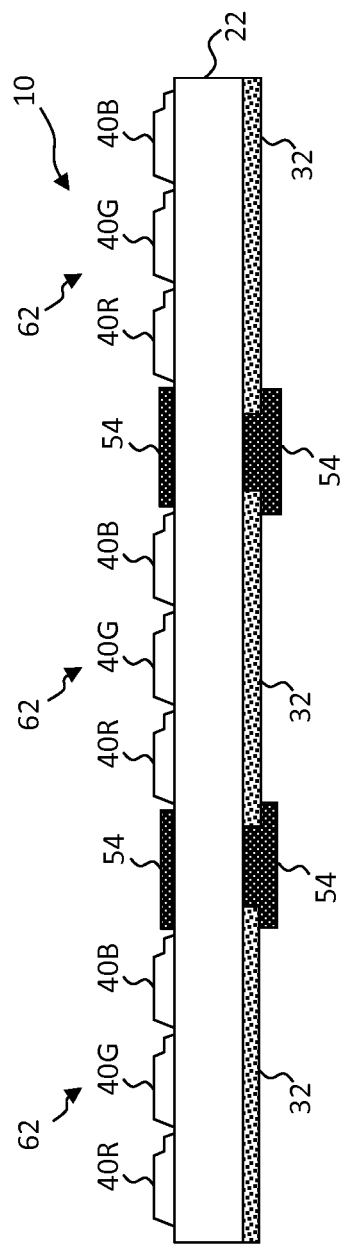

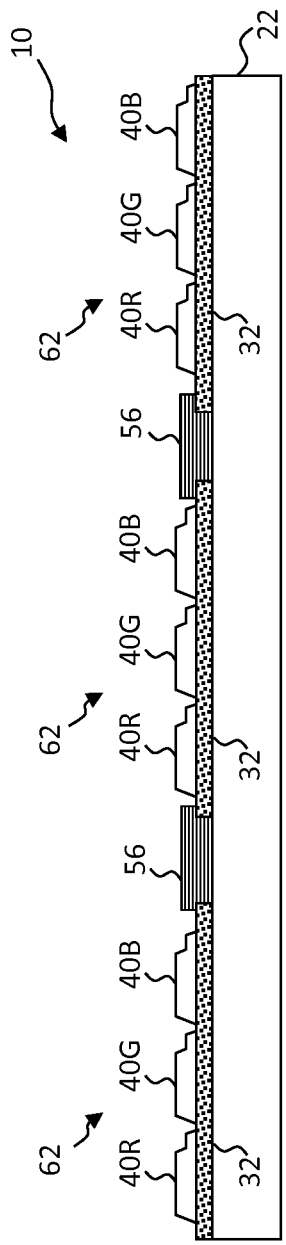
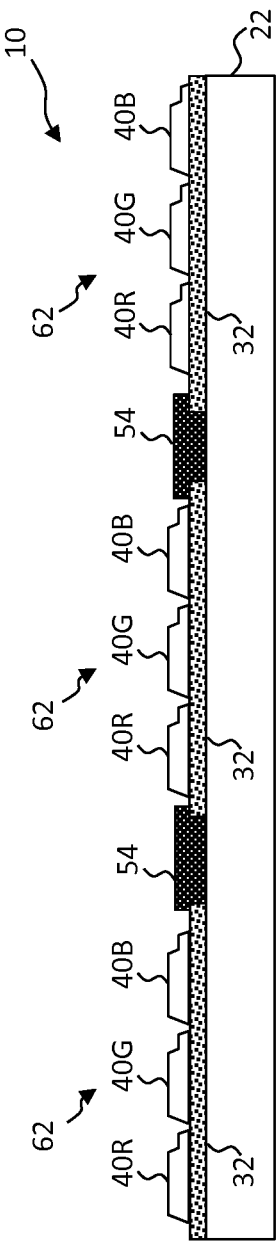

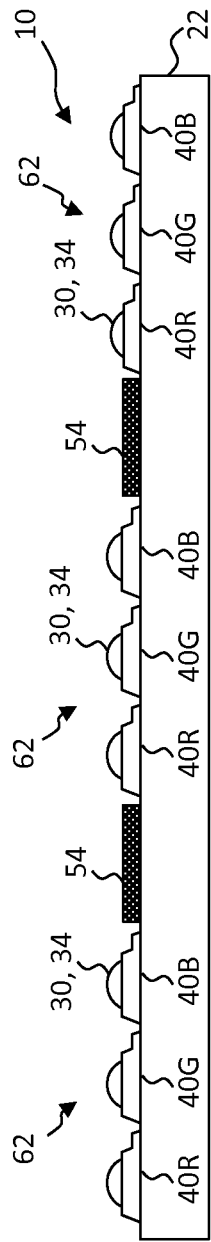
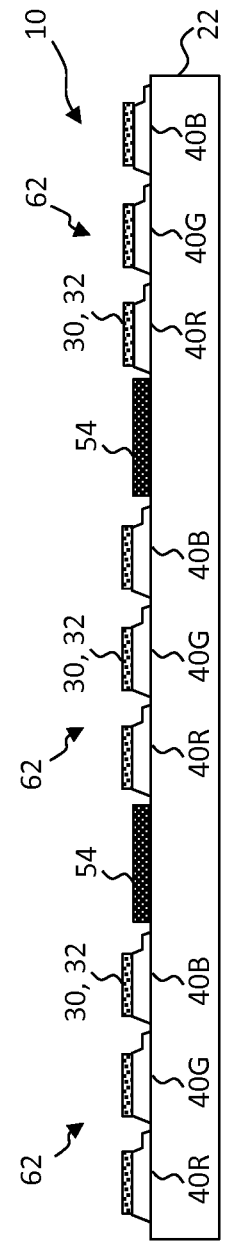

LASER ARRAY DISPLAY

CROSS REFERENCE TO RELATED APPLICATIONS

This application is related to commonly assigned U.S. patent application Ser. No. 14/930,363 filed Nov. 2, 2015, entitled Display with Color Conversion, U.S. patent application Ser. No. 14/788,632 filed Jun. 30, 2015, entitled Inorganic Light-Emitting Diode with Encapsulating Reflector, U.S. patent application Ser. No. 14/743,967 filed Jun. 18, 2015, entitled Micro-Assembled LED Displays and Lighting Elements, U.S. patent application Ser. No. 14/743,975 filed Jun. 18, 2015, entitled Micro Assembled LED Displays and Lighting Elements, U.S. patent application Ser. No. 14/743,984 filed Jun. 18, 2015, entitled Systems and Methods for Preparing GaN and Related Materials for Micro Assembly, U.S. patent application Ser. No. 14/743,988 filed Jun. 18, 2015, entitled Systems and Methods for Controlling Release of Transferable Semiconductor Structures, and U.S. patent application Ser. No. 14/807,311 filed Jul. 23, 2015, entitled Printable Inorganic Semiconductor Method, all of which are hereby incorporated by reference in their entireties.

FIELD OF THE INVENTION

The present invention relates to displays having an array of micro-transfer printed solid-state micro-LED lasers.

BACKGROUND OF THE INVENTION

A wide variety of image displays are in use today. Flat-panel displays presenting information on a display substrate are widely used in portable electronic devices and on desktop computers. Typical flat-panel displays include light-emitting liquid crystal displays (LCDs), organic light-emitting diode (OLED) displays, plasma displays, and reflective displays such as electrophoretic displays. Front-projection displays are also widely used in conference rooms and in theaters. Such displays project light from a projector onto a reflective screen viewed by observers. Rear-projection displays are less commonly used but project light onto the back side of a transmissive screen. One projection display design relies on a common light source whose light output is modulated by a digital micro-mirror device (DMD) or other micro-electro-mechanical systems (MEMS) and filtered to form colored pixels. Other projection display designs use liquid crystals on silicon (LCOS) chips to form pixels. However, white light sources using color filters can produce light that is less saturated than desired and are generally inefficient. To overcome these problems, other projection systems use laser light sources that are reflected from LCOS or MEMS devices or swept across a reflective surface using rotating mirrors. The laser light sources provide essentially monochromatic saturated light and a wide color gamut. However, such projection systems require a relatively large space compared to flat-panel displays.

Conventional cathode ray tube (CRT) displays rely on an electron beam that sweeps over a phosphor-coated display surface on the inside of the tube to form an image. Different phosphors are stimulated by the high-energy electrons to emit different colors of light. For example red, green, and blue phosphors correspond to pixels in the displayed image. However, CRT displays are relatively large, heavy, and bulky.

In general, it is also difficult to provide very bright displays. Liquid crystal displays are very inefficient and organic light-emitting diode (OLED) displays degenerate when operated at high brightness. Although light-emitting diode (LED) displays can operate at relatively high brightness, they can suffer from overheating at high brightness and can be less efficient than desired.

Arrays of infra-red light-emitting vertical-cavity surface-emission lasers (VCSELs) have been micro-transfer printed from a source wafer on which the VCSELs are constructed onto a destination display substrate. For example, see *Heterogeneously Integrated Optoelectronic Devices Enabled by Micro-Transfer Printing* in Advanced Optical Materials (2015, 3, 1313-1335). VCSELs emitting red, green, and blue light are also known and described, for example, in *Advances in Red VCSEL Technology* in Advances in Optical Technology Volume 2012, Article ID 569379 and *Demonstration of Blue and Green GaN-Based Vertical-Cavity Surface-Emitting Lasers by Current Injection at Room Temperature* published 29 Jun. 2011 in Applied Physics Express, Volume 4, Number 7, The Japan Society of Applied Physics.

Despite these light-emitting devices and display systems, there remains a need for devices, systems and methods for providing very efficient and bright displays in a flat form factor suitable for general-purpose viewing.

SUMMARY OF THE INVENTION

Embodiments of the present invention include a micro-LED laser display including an array of display pixels that each incorporate one or more micro-LED lasers together with one or more light spreaders to increase the viewing angle of the display pixels. Micro-LED lasers can be very efficient, particularly at high intensity, and have a monochrome output providing an excellent color gamut. However, the angular dispersion of a laser is typically smaller than is desired for a display. The light spreaders increase the angle of light emission and thereby increase the display viewing angle. In embodiments of the invention, light spreaders can comprise light diffusers or refractive lenses. Such a display provides high efficiency, excellent color gamut, controlled angle of emission and can enable excellent contrast in a flat form factor for both rigid and flexible displays. Relatively simple construction methods, including photolithography and micro-transfer printing, can be employed to reduce costs.

Micro-LED laser displays of the present invention can include monochrome displays or color displays and can incorporate different color light-emitting micro-LED lasers or down-conversion phosphors or fluorophores to provide a full-color display. The micro-LED lasers can be micro-transfer printed. In one embodiment, micro-transfer printed pixel structures include micro-LED lasers with light spreaders; in another embodiment the micro-LED lasers are micro-transfer printed separately from the light spreaders. The light spreaders can be applied to a display substrate separately from the micro-LED lasers, can be applied to the micro-LED lasers, or the micro-LED lasers can be applied to the light spreaders. The light spreaders can also be micro-transfer printable.

According to an embodiment of the present invention, a method of making a display includes providing a source wafer and a display substrate for displaying an image, forming a plurality of micro-transfer printable micro-LED lasers on the source wafer, and micro-transfer printing the micro-LED lasers onto the display substrate to provide an array of display pixels. Each display pixel has one or more micro-LED lasers disposed on the display substrate and each micro-LED laser emits light within an emission angle. One or more light spreaders for increasing the emission angle of light emitted by each micro-LED laser are disposed to receive light emitted by each of the micro-LED lasers and increase the angle of light emission from the display. A controller can individually control the micro-LED lasers.

Light spreaders can include any one or more of diffusive layers, patterned arrays of diffusers, or arrays of refractive lenses or lenslets. In one embodiment, the light spreaders are provided on a display substrate separately from providing the micro-LED lasers. In various other embodiments, the micro-LED lasers are micro-transfer printed onto the display substrate, or micro-transfer printed onto the light spreaders. Alternatively, the light spreaders can be provided on the micro-LED lasers. In other embodiments, the light spreaders and micro-LED lasers are formed or provided on a source wafer as a micro-transfer printable pixel structure and then micro-transfer printed from the source wafer to the display substrate.

In yet another embodiment, the light spreaders are formed as micro-transfer printable light-spreading structures that are independently micro-transfer printed. A micro-transfer printable light spreader comprises a light-spreading article, for example a light diffuser or light-refractive lens. At least a portion of a tether connected to the light-spreading article extends from the light-spreading article. The micro-transfer printable light spreader can comprise a source substrate having a plurality of sacrificial portions with a light-spreading article disposed on each of the sacrificial portions.

Micro-light-emitting diode lasers can be micro-transfer printed onto a micro-transfer printable light spreader to form a heterogeneous pixel structure (a heterogeneous structure has different kinds of elements making up a pixel device or a portion of a pixel device that emits light to provide a display pixel). The heterogeneous pixel structure can be micro-transfer printed as a unit onto a destination substrate such as a display substrate. Alternatively, the light spreaders are micro-transfer printed onto the micro-light-emitting diode lasers to form a pixel structure that can be micro-transfer printed as a single unit onto a destination substrate. In other embodiments, one or the other or both of the micro-light-emitting diode lasers and light-spreading structures are separately micro-transfer printed onto the destination substrate to provide the display pixels.

By providing micro-transfer printable light spreaders or pixel structures on a source substrate at higher density and with a larger fill factor than on a display substrate, the light spreader material is used more efficiently with less waste because the percentage of the source substrate that is dedicated to light spreaders is much greater than for a display substrate, particularly because the light-emissive area of the micro-LED lasers and the consequent aperture ratio of the display substrate is relatively small. Thus, a greater percentage of the light spreader material is applied to the light spreaders in a coating on the source substrate than in a coating on the display substrate so that less light spreader material is wasted in the source substrate coating than is wasted in the display substrate coating.

Local display pixel controllers can also be included in each pixel structure to provide active-matrix control. The display pixel controllers together with the micro-LED lasers and the light spreaders can be constructed in a compound micro assembly structure, for example forming a display tile on a tile substrate. The display tiles can be surface-mountable structures that are readily manipulated, printed, or interconnected on a display substrate using established surface-mount technology techniques. Alternatively, the tiles can be micro-transfer printable to a display substrate.

The micro-light-emitting diode lasers can be made using crystalline semiconductors in a semiconductor wafer and then micro-transfer printed to a display substrate, for example a glass substrate, thus increasing the light-output efficiency and resolution of the micro-LED lasers and reducing the substrate and assembly cost. In one embodiment, the micro-LED lasers are solid-state organic or inorganic micro-LED lasers.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 5-7 are cross sections of alternative arrangements of pixel structures corresponding to FIGS. 2-4 on a display substrate according to various embodiments of the present invention;

FIGS. 10-13 are cross sections of micro-LED lasers and alternative light spreaders on opposites sides of a display substrate with arrangements of light absorbers or light reflectors according to various embodiments of the present invention;

FIGS. 14-17 are cross sections of arrangements of micro-LED lasers and light spreaders on a common side of a display substrate with arrangements of light absorbers or light reflectors according to various embodiments of the present invention;

FIGS. 18-19 are cross sections of micro-LED lasers and alternative light spreaders on a common side of a display substrate with arrangements of light absorbers according to various embodiments of the present invention;

Figure 1:
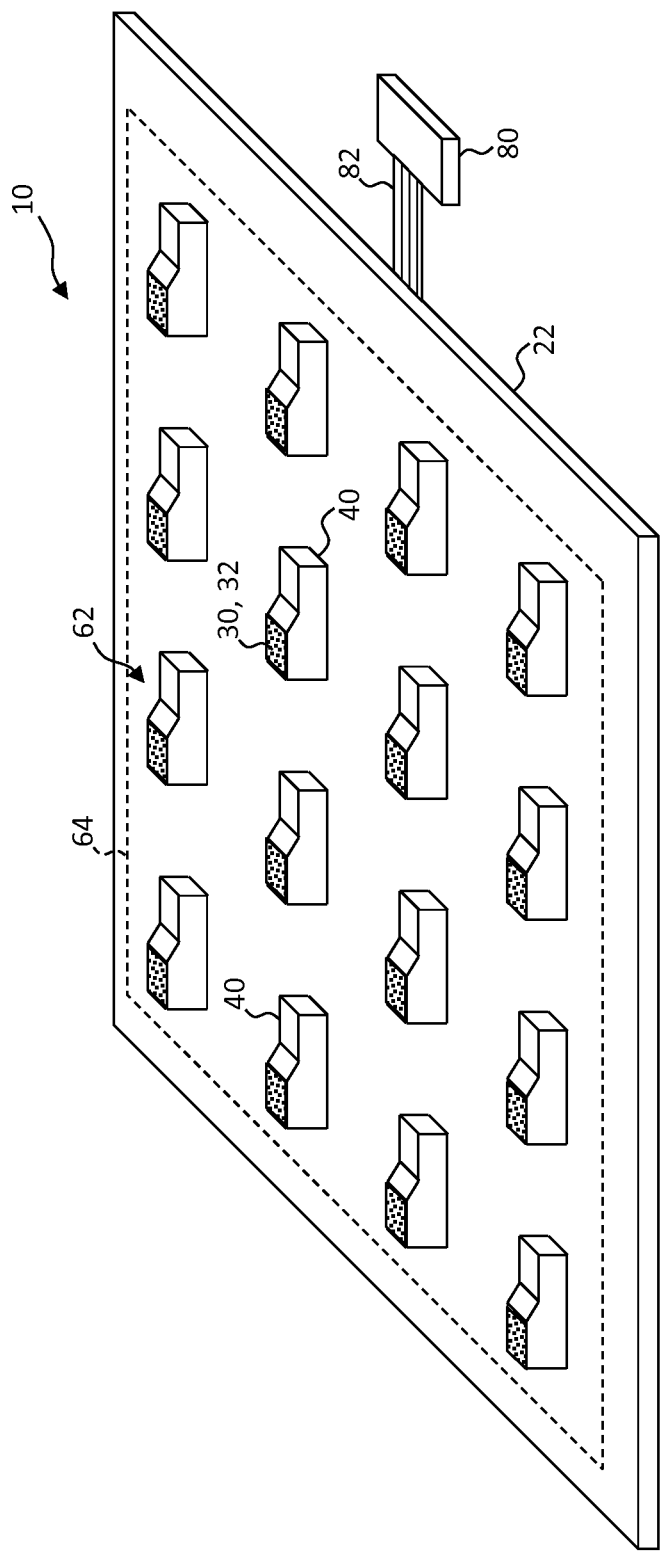
FIG. 1 is a perspective of a micro-LED laser display according to an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to FIG. 1, an embodiment of the present invention provides a micro-LED laser display 10 comprising a display substrate 22 for displaying an image and an array 64 of display pixels 62. Each display pixel 62 has one or more micro-LED lasers 40 disposed on the display substrate 22 that emit light within an emission angle to form an image pixel. In the example shown in FIG. 1, each display pixel 62 includes a single micro-LED laser 40. In alternative examples, each display pixel 62 includes more than one (e.g., three) micro-LED lasers 40. One or more light spreaders 30 are located in correspondence to one or more of the micro-LED lasers 40 to increase the emission angle of light emitted by each micro-LED laser 40. A controller 80 individually controls the micro-LED lasers 40, for example with electrical signals transmitted to the micro-LED lasers 40 through a bus 82 connected to the controller 80.

The light spreaders 30 can have various structures and include various materials in various embodiments of the present invention. In one embodiment and as shown in FIG. 1, the one or more light spreaders 30 are light diffusers 32 disposed to receive and diffuse light emitted by the micro-LED lasers 40 and are provided in a patterned array of light diffusers 32. Each light diffuser 32 can include a plurality of light reflective or light-refractive particles in a substantially transparent matrix, such as a resin or polymer or curable resin or curable polymer. The light diffusers 32 can also include phosphorescent or fluorescent materials that further diffuse light and can reduce speckle from optical interference in the coherent light emitted by the micro-LED lasers 40.

The array of light diffusers 32 illustrated in FIG. 1, can be formed by first micro-transfer printing the micro-LED lasers 40 onto the display substrate 22 and then coating the display substrate 22 and the micro-LED lasers 40 with a curable liquid including diffusive particles, such as transparent glass particles or beads or reflective particles such as metallic or metal-coated particles. The coating is then photolithographically processed (for example, by exposing the curable liquid to patterned light to pattern-wise cure the liquid). The uncured liquid is then removed, for example by washing, to form the patterned light diffuser 32 array.

The display substrate 22 can be a rigid or flexible substrate and can comprise glass, metal, or plastic materials having substantially parallel opposed sides, on one or both of which micro-LED lasers 40 and light spreaders 30 are disposed in various configurations as discussed further below. The display substrate 22 can be relatively small, for example one cm by one cm, or quite large, for example 5 meters by 10 meters, and can have a range of thicknesses, for example from 100 microns to several centimeters. The controller 80 can be a single controller 80 located on the display substrate 22 or external to the display substrate 22 (as shown). In an alternative embodiment, the controller 80 includes multiple or additional controllers 80 located on the display substrate 22, each of which can control an individual or group of individual display pixels 62 in a distributed control configuration (not shown). Signals for controlling the display pixels 62 can include wires formed over the display substrate 22 using photolithographic methods and materials, such as evaporatively deposited metal or inkjet-deposited metallic inks.

The display pixels 62 can have a relatively low resolution, for example having one display pixel 62 per millimeter in a direction over the display substrate 22, or a high resolution, for example having 100 display pixels 62 per millimeter in a direction over the display substrate 22. The display pixels 62 can all emit the same single color of light, forming a monochrome micro-LED laser display 10, or each display pixel 62 can include different micro-LED lasers 40 that each emit different colors of light, for example red, green, and blue. Alternatively, light emitted from some or all of the micro-LED lasers 40 can be down-converted, for example with phosphorescent materials, fluorescent materials, or quantum dots to a color of light different from the color of light emitted by the micro-LED lasers 40. Light emitted from different micro-LED lasers 40 can be down-converted to different colors of light forming different sub-pixels within a display pixel 62.

A micro-LED laser display 10 of the present invention can be employed as a flat-screen display or as a backlight unit in a display such as a liquid crystal display. The number of display pixels 62 in the micro-LED laser display 10 can be relatively low, for example a ten by ten array with one hundred display pixels 62 to a very large high-definition display with approximately 1000 by 2000 display pixels 62 or even a 4 k or 8 k display with 2000 by 4000 display pixels 62 or 4000 by 8000 display pixels 62 (e.g., a display with 1000 by 2000 to 2000 by 4000 display pixels 62 or 2000 by 4000 to 4000 by 8000 display pixels 62).

Display pixels 62 of the present invention can be provided on the display substrate 22 using micro-transfer printing from a source substrate to a destination substrate, such as a display substrate 22. The micro-transfer printing process is useful for a wide variety of structures and substrates, and can be applied to thin, flexible polymer substrates having a thickness of only 10 or 100 microns or to rigid substrates, for example glass substrates, having a thickness of 200 microns and much larger, for example 2 centimeters. For example, the substrate may have a thickness from 10 to 50 microns, 100 microns to 500 microns, 500 microns to a millimeter, or a millimeter to a centimeter.

According to embodiments of the present invention, each display pixel 12 in the micro-LED laser display 10 includes one or more micro-LED lasers 40 for emitting colored light for each color in the display pixel 12. Furthermore, in embodiments of the present invention, the micro-LED lasers 40 of the present invention are disposed on the display substrate 22 forming the image viewed by an observer. In contrast, prior-art displays using lasers are projection displays that have only one laser for each emitted display color independently of the number of display pixels and are not located on the viewed display substrate but are rather located remotely from the display substrate and project light onto the display substrate (in this case a viewing screen).

According to embodiments of the present invention, micro-LED lasers 40 are micro-transfer printed to a display substrate 22. The light spreaders 30 can also be formed in a micro-transfer printable structure and micro-transfer printed to the display substrate 22. A micro-LED laser 40 can be micro-transfer printed onto a light spreader 30 on the display substrate 22 (e.g., the light spreaders can be micro-transfer printed first). Alternatively, light spreaders 30 can be micro-transfer printed onto printed micro-LED lasers 40 on the display substrate 22.

Alternatively, the light spreaders 30 can be micro-transfer printed to the micro-LED lasers 40 or the micro-LED lasers 40 can be micro-transfer printed onto the light spreaders 30 before either (or the collective unit) is micro-transfer printed to the display substrate 22. For example, the light spreaders 30 can be micro-transfer printed to respective micro-LED lasers 40 (e.g., before the sacrificial layer for the micro-LED lasers 40 is removed). In certain embodiments, combinations of micro-LED lasers 40 and light spreaders 30 form micro-transfer printable pixel structures 60 (discussed further below) that can be micro-transfer printed as units to a display substrate 22. In other embodiments, the light spreaders 30 are formed directly on the display substrate 22 or formed directly on the micro-LED lasers 40.

Figure 2:
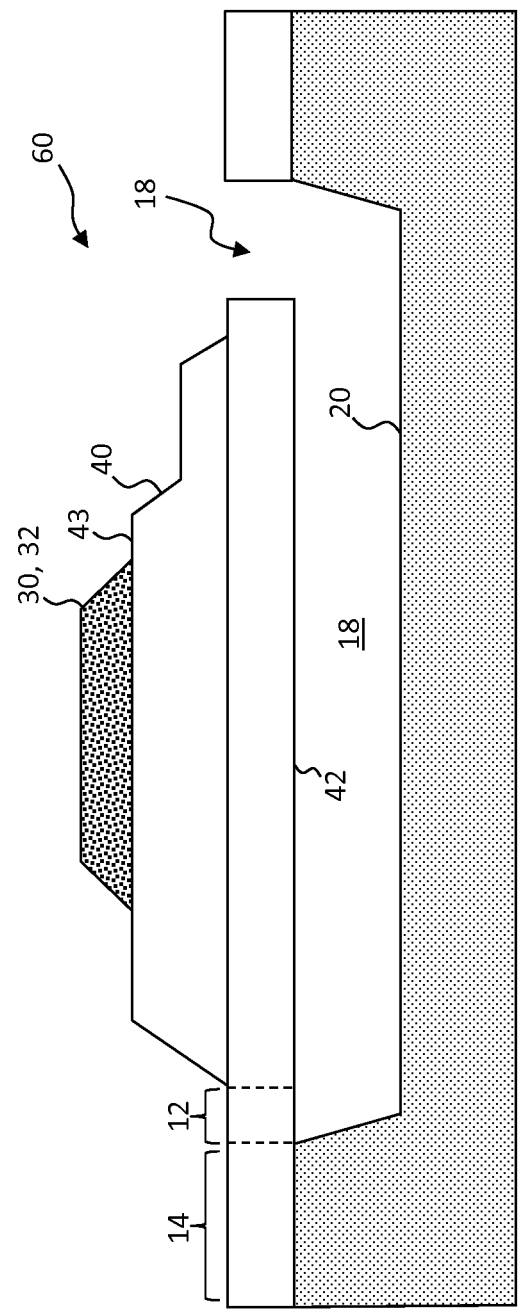
FIGS. 2-4 are cross sections of alternative pixel structures on a source wafer according to various embodiments of the present invention.

In an embodiment illustrated in FIG. 2, the micro-LED laser 40 is formed on a dielectric layer 42 over a sacrificial portion 18 of a source substrate 20 using photolithographic methods. Alternatively, the portion of the dielectric layer 42 above the sacrificial portion 18 can be a portion of the micro-LED laser 40. In this example, the micro-LED laser 40 has electrical contacts (not shown in FIG. 2) on the same side of the micro-LED laser 40. Such a micro-LED laser 40 structure is referred to as a horizontal structure as opposed to a vertical structure that has an electrical contact on each side of a micro-LED laser 40. In the embodiment illustrated in FIG. 2, a light diffuser 32 forming a light spreader 30 is formed on the light-emission side 43 of the micro-LED laser 40 that emits light from the micro-LED laser 40. Such a light diffuser 32 can be formed by coating the source substrate 20 with a curable liquid containing diffusive light-reflective or light-refractive particles and then pattern-wise developing the curable liquid. The light spreader 30 and the micro-LED laser 40 form one or more micro-transfer printable pixel structures 60 that are together connected to the source substrate 20 with a tether 12 physically connected to an anchor 14 portion of the source substrate 20. The sacrificial portion 18 can be a patterned material in a layer, such as an etchable material, for example an oxide material that can be etched, or a designated portion of the source substrate 20 that can be preferentially etched, to form a cavity (as shown). Once the pixel structures 60 are each formed over a sacrificial portion 18, the sacrificial portions 18 are etched to form cavities that are also referred to herein as sacrificial portions 18. The pixel structures 60 can then be released from the source substrate 20, for example using a micro-transfer printing stamp made of an elastomer such as PDMS, by pressing the stamp against the pixel structures 60 to crack or fracture the tethers 12 leaving the pixel structures 60 adhered to the stamp. The pixel structures 60 are then adhered to the destination or display substrate 22 to form an array of top-emitting display pixels 62.

Figure 3:
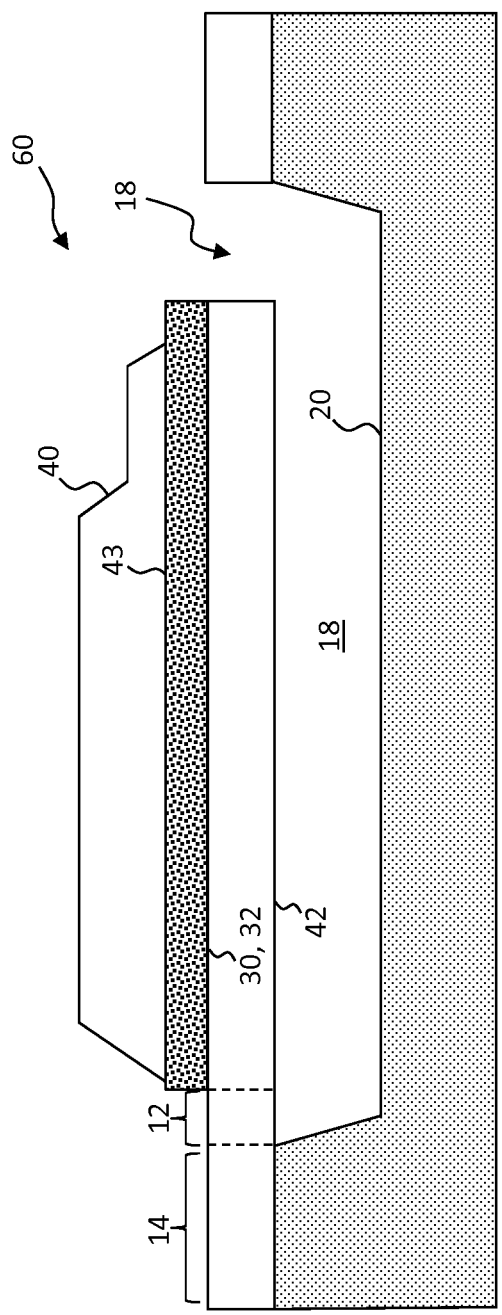

Referring to FIG. 3, in an alternative embodiment, the light spreader 30 is a light diffuser 32 that is first formed on a dielectric layer 42 (or the light spreader 30 can be the dielectric layer 42 or the dielectric layer 42 can include the light spreader 30, not shown) over the sacrificial portions 18 of the source substrate 20 for example by coating a curable liquid containing light diffusive particles and photolithographically patterning the curable liquid over the source substrate 20. The dielectric layer 42 forms the tether 12 and anchor 14. Micro-LED lasers 40 having a light-emission side 43 adjacent to the light spreader 30 are formed on the light spreader 30 and the sacrificial portion 18 is then etched to form a cavity beneath the micro-transfer printable pixel structures 60. The micro-transfer printable pixel structures 60 are then micro-transfer printed to the display substrate 22 to form an array of bottom-emitting display pixels 62.

In both the cases of FIGS. 2 and 3, the curable liquid coating with diffusive particles is more efficiently used since the spatial density of the pixel structures 60 is greater on the source substrate 20 than the display substrate 22, so that less liquid and fewer particles are wasted. In both cases, it is also possible to use an intermediate stamp to print the pixel structures 60 in an inverted arrangement on the display substrate 22 so that the pixel structures 60 of FIG. 2 emit light through the display substrate 22 (a bottom-emitting configuration) and the pixel structure 60 of FIG. 3 emit light in a direction opposite the display substrate 22 (a top-emitting configuration).

Figure 4:
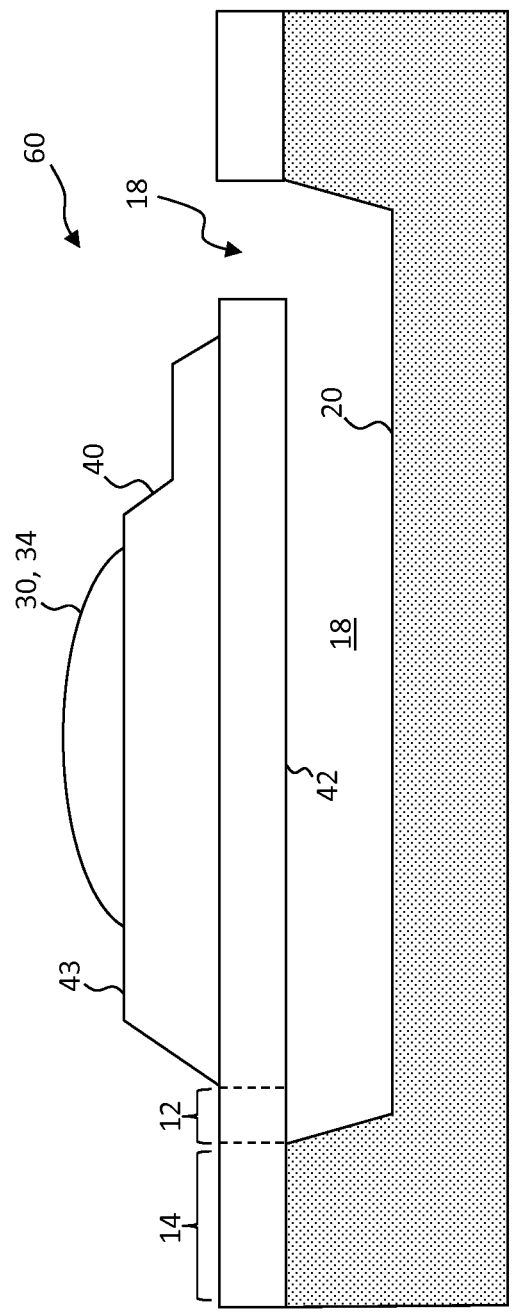

Referring next to FIG. 4, in another embodiment the light spreader 30 is a light refractive lens 34 or lenslet or an array of refractive lenses 34 or lenslets, for example a lenslet 34 formed or disposed on the light-emission side 43 of the micro-LED laser 40. Each refractive lens 34 is disposed to refract the light of a corresponding micro-LED laser 40. Lenslets 34 can be made using micro-lithography on the micro-LED lasers 40 or can be made elsewhere and then applied to the micro-LED lasers 40, for example by laminating the lenslets 34 on the micro-LED lasers 40. Lenslets can be made using micro-lithographic techniques and materials. Once the light-refractive lens 34 is disposed on the micro-LED laser 40, the resulting pixel structure 60 can be released from the display substrate 22 by etching the sacrificial portion 18 thereby forming the tether 12 and anchor 14 and micro-transfer printed onto the display substrate 22.

Referring to FIG. 5, the pixel structure 60 illustrated in FIG. 2 is shown micro-transfer printed onto the display substrate 22 in a top-emitter configuration. An array of such pixel structures 60 forms a micro-LED laser display 10 (not shown). Additional dielectric layer 42 materials are disposed on the corners of the micro-LED laser 40 to protect them from the first and second electrodes 46 and 48 formed over the display substrate 22 and the micro-LED laser 40. The first and second electrodes 46, 48 are electrically connected to electrical contacts on the micro-LED lasers 40 (not shown). The dielectric layer 42 materials and first and second electrodes 46, 48 can be formed using photolithographic processes. In operation, electrical current is provided from the controller 80 (FIG. 1) through the first and second electrodes 46, 48 to the electrical contacts on the micro-LED laser 40, causing the micro-LED laser 40 to emit substantially collimated laser light 50 that passes through the light-emission side 43 of the micro-LED laser 40 into the light spreader 30, in this case a light diffuser 32. The light diffuser 32 receives the substantially collimated laser light 50 and diffuses it so that the spread light 52 has an increased angle of emission or viewing angle, for example Lambertian. In various embodiments, the light diffuser 32 has a thickness, density, and selection of particles to provide a desired angular emission profile.

Referring to FIG. 6, the pixel structure 60 illustrated in FIG. 3 is shown micro-transfer printed onto the display substrate 22 in a bottom-emitter configuration. An array of such pixel structures 60 forms a micro-LED laser display 10 (not shown). Additional dielectric layer 42 materials are disposed on the corners of the micro-LED laser 40 to protect them from the first and second electrodes 46 and 48 formed over the display substrate 22 and the micro-LED laser 40. The first and second electrodes 46, 48 are electrically connected to electrical contacts on the micro-LED lasers 40 (not shown). The additional dielectric layer 42 materials can also, but do not necessarily, cover the corners of the light spreader 30. The dielectric layer 42 materials and first and second electrodes 46, 48 can be formed using photolithographic processes. In operation, electrical current is provided from the controller 80 (FIG. 1) through the first and second electrodes 46, 48 to the micro-LED laser 40, causing the micro-LED laser 40 to emit substantially collimated laser light 50 that passes through the light-emission side 43 of the micro-LED laser 40 into the light spreader 30, in this case a light diffuser 32. The light diffuser 32 receives the substantially collimated laser light 50 and diffuses it so that the spread light 52 has an increased angle of emission or viewing angle, for example Lambertian. The spread light 52 can pass into the display substrate 22 that, in this case, is substantially transparent to the spread light 52, for example more than 50%, 80%, 90%, or 95% transparent. One or more of the materials in the light diffuser 32, for example a transparent matrix for light-diffusive particles, can have an optical index chosen to match the optical index of the display substrate 22. In various embodiments, the light diffuser 32 has a thickness, density, and selection of particles to provide a desired angular emission profile.

Referring to FIG. 7, the pixel structure 60 illustrated in FIG. 4 is shown micro-transfer printed onto the display substrate 22 in a top-emitter configuration. An array of such pixel structures 60 forms a micro-LED laser display 10 (not shown). Additional dielectric layer 42 materials are disposed on the corners of the micro-LED laser 40 to protect them from the first and second electrodes 46 and 48 formed over the display substrate 22. The first and second electrodes 46, 48 are electrically connected to electrical contacts on the micro-LED lasers 40 (not shown). The dielectric layer 42 materials and first and second electrodes 46, 48 can be formed using photolithographic processes. In operation, electrical current is provided from the controller 80 (FIG. 1) through the first and second electrodes 46, 48 to the micro-LED laser 40, causing the micro-LED laser 40 to emit substantially collimated laser light 50 that passes through the light-emission side 43 of the micro-LED laser 40 into the light spreader 30, in this case a refractive lens 34. The refractive lens 34 receives the substantially collimated laser light 50 and refracts it so that the spread light 52 has an increased angle of emission or viewing angle. In various embodiments, the refractive lens 34 has a thickness, curvature, and optical index to provide a desired angular emission profile. An array of refractive lenses 34 can be formed in a common layer.

Figure 8:
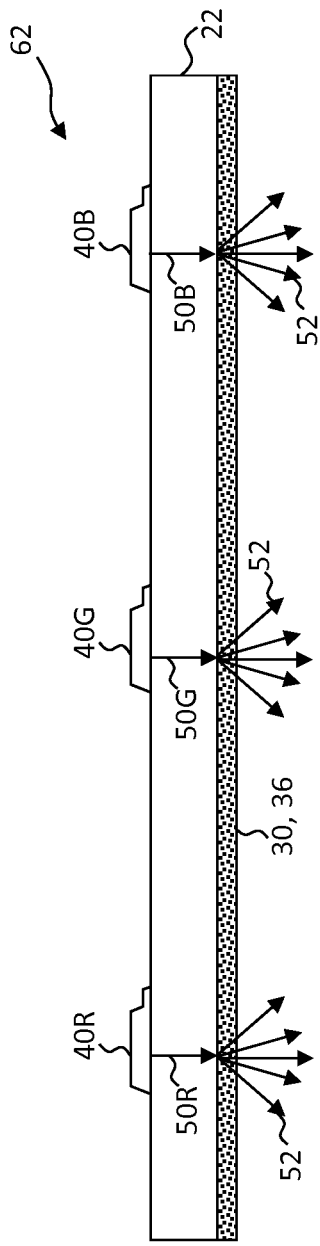
FIGS. 8-9 are cross sections of arrangements of micro-LED lasers and alternative light spreaders on opposites sides of a display substrate according to embodiments of the present invention.
Figure 9:
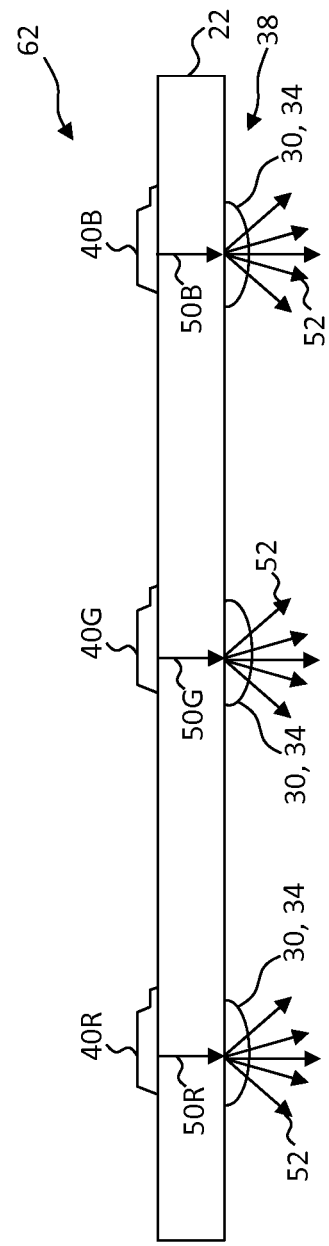

Referring to FIGS. 8 and 9, a micro-LED laser display 10 of the present invention can include a display substrate 22 having one or more display pixels 62 disposed thereon. Each display pixel 62 includes one or more micro-LED lasers 40 and one or more light spreaders 30 for increasing the angle of light emitted by each micro-LED laser 40. The embodiment of FIGS. 8 and 9 show a single display pixel 62 including three different micro-LED lasers 40, one each emitting red micro-LED laser light 50R, green micro-LED laser light 50G, and blue micro-LED laser light 50B. In the embodiment of FIG. 8, the light spreaders 30 are incorporated into a single light-diffusive layer 36 that diffuses the light from all of the red, green, and blue micro-LED lasers 40R, 40G, 40B to provide spread light 52 of each color, for example red, green, and blue. Alternatively, or additionally, color-conversion materials can be included in the light diffusers 30 to provide differently colored light. In the embodiment of FIG. 9, the light spreaders 30 are refractive lenses 34 that refract the light from each of the red, green, and blue micro-LED lasers 40R, 40G, 40B to provide spread light 52 of each color, for example red, green, and blue.

In FIGS. 5-7, the micro-LED lasers 40 and the light spreaders 30 are located on a common side of the display substrate 22. In some embodiments, for example FIGS. 5 and 7, the micro-LED lasers 40 are disposed between the light spreaders 30, for example one or more light diffusers 32 or array of refractive lenses 34, and the display substrate 22. In a different embodiment shown in FIG. 6, the light spreaders 30 are disposed between the micro-LED lasers 40 and the display substrate 22. These two embodiments can be constructed by micro-transfer printing pixel structures 60, as shown in FIGS. 2-4. Alternatively, as shown in FIGS. 8 and 9, the display substrate 22 is disposed between the micro-LED lasers 40 and the light spreaders 30. This embodiment can be constructed by micro-transfer printing micro-LED lasers 40 on one side of the display substrate 22 and forming, coating, laminating, or micro-transfer printing light spreaders 30 onto an opposite side of the display substrate 22.

Referring to FIGS. 10 and 11, light absorbers 54 are provided in the structures of FIGS. 8 and 9, respectively. In FIG. 10, light absorbers 54, for example a coating of a polymer or resin containing carbon black photolithographically patterned over the surface of the display substrate 22, are disposed between the micro-LED lasers 40 along the surface of the display substrate 22 on which the micro-LED lasers 40 are disposed. In both FIGS. 10 and 11, light absorbers 54 are disposed between the light spreaders 30 along the surface of the display substrate 22. Thus, in FIG. 10, light absorbers 54 are disposed on both sides of the display substrate 22 between the micro-LED lasers 40 on one side and between the light spreaders 30 on the opposing side and in FIG. 11 the light absorbers 54 are located only on the side of the display substrate 22 that on which the light spreaders 30 are disposed.

In FIG. 10, the light spreaders 30 are light diffusers 32 and extend along the surface of the display substrate 22 from one sub-pixel (e.g., micro-LED laser 40R) to another sub-pixel (e.g., micro-LED laser 40G), have a size approximately that of an image pixel, and can extract light trapped in the display substrate 22. In contrast, the light diffusers 32 incorporated into pixel structures 60 (e.g., as shown in FIGS. 2 and 3) have a size approximately (e.g., within 5%, 10%, 20% or 25%) that of the light-emitting area of the micro-LED laser 40. In FIG. 11, the light spreaders 30 are light refractive lenses 34 forming a lenslet array 38 and each lenslet 34 is approximately limited to the size of the light-emitting area of the micro-LED laser 40. In this case, the light absorbers 54 on the light spreader 30 side of the display substrate 22 are much larger than in the case of FIG. 10 and can therefore provide a greater ambient contrast. Moreover, the refractive lenses 34 of FIG. 11 can reduce the amount of light trapped in the display substrate compared to the light diffusers 32 of FIG. 10.

In general, the light absorbers 54 absorb ambient light and reduce reflection from the micro-LED laser display 10 and also, especially in the FIG. 10 embodiment using light diffusers 32, absorb stray or trapped light. For example, diffused and spread laser light 52 (FIG. 8) can be reflected or refracted into the display substrate 22 and propagate through the substrate display 22 and be emitted in an area associated with a different display pixel 62, thereby reducing the display sharpness. Thus, the light absorbers 54 improve ambient contrast and display sharpness.

Referring to FIGS. 12-19, a micro-LED laser display 10 includes a plurality of display pixels 62 disposed in an array on the display substrate 22. Each display pixel 62 has one or more micro-LED lasers 40 disposed on the display substrate 22 that emits light within an emission angle. One or more light spreaders 30 are disposed with respect to the micro-LED lasers 40 to receive or intercept the substantially collimated laser light 50 emitted by the micro-LED lasers 40 and spread the emitted substantially collimated laser light to increase the emission angle of light emitted by each display pixel 62. In these embodiments, micro-LED lasers 40 are grouped into display pixels 62 that each include a red, green, and blue micro-LED laser 40R, 40G, 40B light emitter. Thus, as shown in FIGS. 12-19, a micro-LED laser display 10 can comprise two or more arrays of micro-LED lasers 40. The micro-LED lasers 40 in each array are spatially interdigitated to form display pixel 62 groups of spatially adjacent micro-LED lasers 40.

As shown in FIGS. 12-15, all of the micro-LED laser 40 light emitters within one display pixel 62 emit substantially collimated laser light 50 into a common light spreader 30, in these embodiments a light diffuser 32. The common light diffuser 32 for a display pixel 62 assists in mixing the light from the display pixel 62. In FIGS. 12 and 13, the display substrate 22 is located between the micro-LED lasers 40 and the light spreaders 30. In FIG. 12, a light reflector 56 is disposed between the light diffusers 32 to reflect light propagating horizontally in the light diffuser 32 layer. In both FIGS. 12 and 13, light absorbers 54 are located to absorb light propagating in the display substrate 22 and to absorb ambient light. Thus, in various embodiments, light reflectors 56 or light absorbers 54 are disposed between the light spreaders 30, the micro-LED lasers 40, or both along a surface of the display substrate 22, and optionally over at least a portion of the light spreader 30.

Referring to FIGS. 14 and 15, the light spreaders 30 are located between the micro-LED lasers 40 and the display substrate 22 in a bottom emitter configuration that emits light through the display substrate 22. In FIG. 14, a light reflector 56 is disposed between the micro-LED lasers 40 to reflect light propagating horizontally in the display substrate 22 to increase light output and efficiency. In FIG. 15, a light absorber 54 is disposed between the micro-LED lasers 40 to absorb light propagating horizontally in the display substrate 22 to increase sharpness. The light absorber 54 is located at least partly over the light diffuser 32. In an embodiment, an anti-reflection layer is disposed on the display substrate 22 on a side of the display substrate 22 opposite the micro-LED lasers 40 (not shown).

Figure 16:
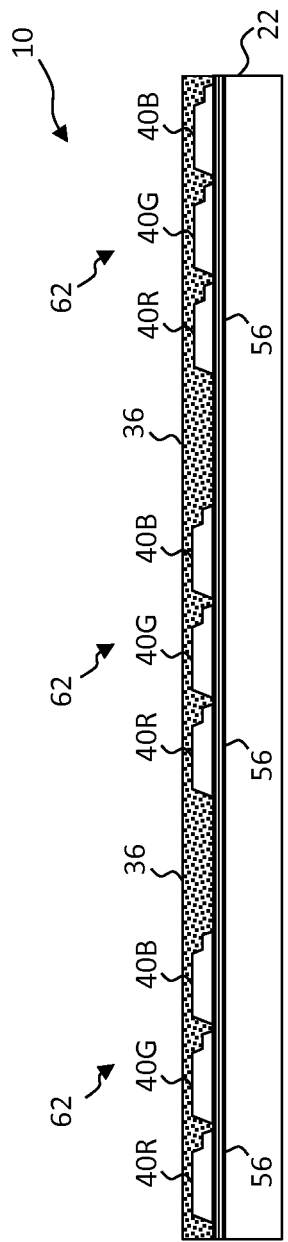
Figure 17:
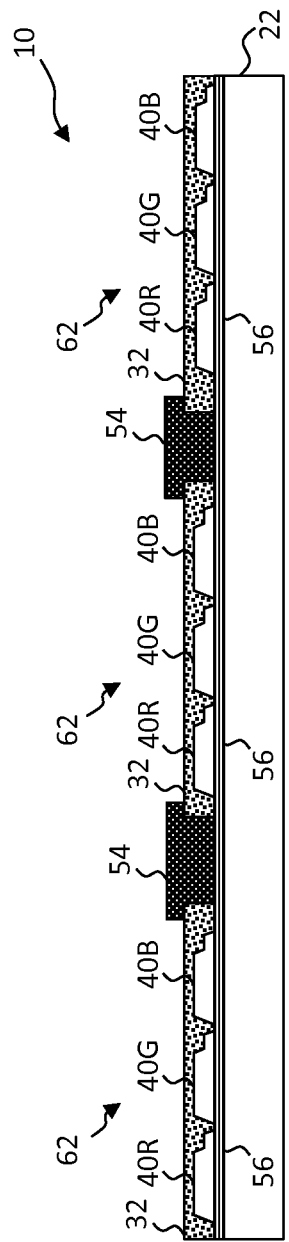

Referring to FIGS. 16 and 17, the micro-LED lasers 40 are located between the light spreaders 30 and the display substrate 22. Referring to FIG. 16, a light-diffusive layer 36 is blanket coated over the micro-LED lasers 40 to diffuse light emitted from the micro-LED lasers 40 and increase the viewing angle of the light emitted from the micro-LED laser display 10. A light reflector 56 is disposed between the display substrate 22 and the light diffuser 32 to reflect any light directed toward the display substrate 22 and thereby increase the light output efficiency. In this embodiment, the display substrate 22 need not be transparent.

In FIG. 17, the light-diffusive layer 36 is patterned, for example using photolithographic processes, into individual light diffusers 32. Each light diffuser 32 receives light from all of the micro-LED lasers 40 in one display pixel 62. Such an arrangement can improve color mixing from the display pixel 62. A light absorber 54 reduces light propagating from one display pixel 62 to a neighboring display pixel 62, thereby improving the micro-LED laser display 10 sharpness.

As shown in FIGS. 18 and 19, the light spreaders 30 are located exclusively on the light-emitting portions of the micro-LED lasers 40, for example in the pixel structure 60 configurations of FIGS. 2 and 4, respectively. As shown in FIG. 18, refractive lenses 34 form the light spreaders 30 and in FIG. 19, light diffusers 32 form the light spreaders 30. In both cases, a light absorber 54 is located between the display pixels 62 to improve the ambient contrast of the micro-LED laser display 10. Although not shown, the light absorbers 54 could also be disposed between the red, green, and blue micro-LED lasers 40R, 40G, and 40B within the area of a display pixel 12 to further absorb ambient light.

The light absorbers 54 and light reflectors 56 can be constructed using photolithographic processes and materials, for example reflective evaporated metals, coated curable resins with embedded light absorbing materials such as carbon black, photoresists, and masks for patterning evaporatively deposited metals or for patterning radiation for pattern-wise curing a layer of curable resin. A surface of the display substrate 22 can include layers formed on an underlying substrate, for example planarization or encapsulation layers formed on a glass or polymer substrate.

In embodiments of the present invention, the micro-LED lasers 40 are solid-state lasers, semiconductor-based lasers, light-emitting diode lasers, diode-pumped solid-state lasers (DPSSLs), a vertical-cavity surface-emission laser (VC-SEL), or colloidal quantum-dot vertical-cavity surface-emission laser (CQD-VCSEL). In various usages, these various descriptive laser terms are not always mutually exclusive or refer to more than type of laser or describe lasers that are considered to be members of more than one category. As intended herein, the micro-LED laser 40 is a laser that uses solid materials and has a size that enables the micro-LED laser 40 to be micro-transfer printed. For example, each micro-LED laser 40 has a width from 2 to 5 µm, 5 to 10 µm, 10 to 20 µm, or 20 to 50 µm, each micro-LED laser 40 has a length from 2 to 5 µm, 5 to 10 µm, 10 to 20 µm, or 20 to 50 µm, or each micro-LED laser 40 has a height from 2 to 5 µm, 4 to 10 µm, 10 to 20 µm, or 20 to 50 µm. In an embodiment, each micro-LED laser 40 has an anode and a cathode disposed on a same side of the respective micro-LED laser 40 and, optionally, the anode and cathode of a respective micro-LED laser 40 are horizontally separated by a horizontal distance. In various configurations, the horizontal distance is from 100 nm to 500 nm, 500 nm to 1 micron, 1 micron to 20 microns, 20 microns to 50 microns, or 50 microns to 100 microns.

In various embodiments, the display substrate 22 has a contiguous display substrate area that includes the micro-LED lasers 40, each micro-LED laser 40 has a light-emissive area, and the combined light-emissive areas of the micro-LED lasers 40 is less than or equal to one-quarter of the contiguous display substrate area. Alternatively, the combined light-emissive areas of the micro-LED lasers 40 is less than or equal to one eighth, one tenth, one twentieth, one fiftieth, one hundredth, one five-hundredth, one thousandth, one two-thousandth, or one ten-thousandth of the contiguous display substrate area.

The pixel structure 60 illustrated in FIGS. 2-4 can be made using photolithographic methods on a source substrate 20, for example a source wafer 20 such as a semiconductor wafer including silicon, such as silicon (1 1 1) or silicon (1 0 0). In an embodiment of the present invention, an array of pixel structures 60 are formed on a corresponding array of sacrificial portions 18 on a source wafer 20. The sacrificial portions 18 can be portions of a sacrificial layer and can be etched to form an array of cavities over which the pixel structures 60 are disposed. Each pixel structure 60 comprises a micro-transfer printable micro-LED laser 40 and one or more light spreaders 30 for increasing the emission angle of light emitted by each micro-LED laser 40. In a further embodiment of the present invention, the light spreader 30 is a light diffuser 32 or refractive lens or lenslet 34 disposed on the micro-transfer printable micro-LED lasers 40 on a side of the micro-transfer printable micro-LED lasers 40 opposite the sacrificial portion 18 (as shown in FIG. 2). Alternatively, the light diffusers 32 or refractive lenses or lenslets 34 are disposed between the micro-transfer printable micro-LED lasers 40 and the sacrificial portion 18 (as shown in FIG. 3).

Figure 20:
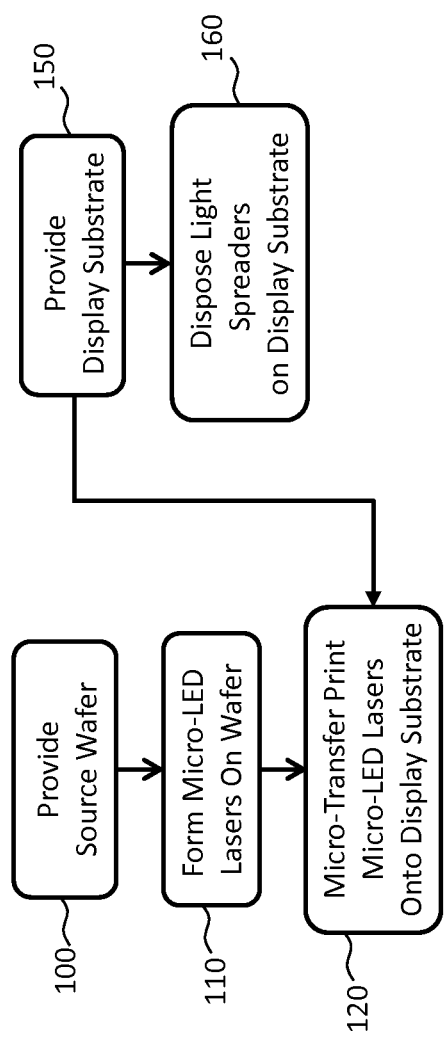
FIGS. 20-24 are flow diagrams illustrating methods in various embodiments of the present invention.

Referring to FIG. 20, in a method of the present invention, a method of making a micro-LED laser display 10 comprises providing a source wafer 20 in step 100 and a display substrate 22 for displaying an image thereon in step 150. A plurality of micro-transfer printable micro-LED lasers 40 are formed on the source wafer 20 in step 110. The micro-LED lasers 40 are micro-transfer printed onto the display substrate 22 in step 120. Each display pixel 62 has one or more micro-LED lasers 40 disposed on the display substrate 22 and each micro-LED laser 40 emits substantially collimated laser light 50 within an emission angle. One or more light spreaders 30 for increasing the emission angle of light emitted by each micro-LED laser 40 are disposed in relation to the micro-LED laser 40 to receive the substantially collimated laser light 50 emitted by the micro-LED laser 40 in step 160 to provide an array of display pixels 62. A controller 80 such as a display controller individually controls the micro-LED lasers 40 to emit light at a desired luminance or brightness. In embodiments of the present invention, disposing the light spreaders 30 in step 160 includes disposing or forming one or more refractive lenses 34 or a lenslet array or one or more light diffusers 32 on the display substrate 22, for example by patterning a light-diffusive layer 36 over the display substrate 22, by laminating or micro-lithographically forming a lenslet array over the display substrate 22, or by forming a micro-transfer printable light spreader 30 and micro-transfer printing the light spreader 30 onto the display substrate 22, as illustrated in FIGS. 8 and 9.

Figure 21:
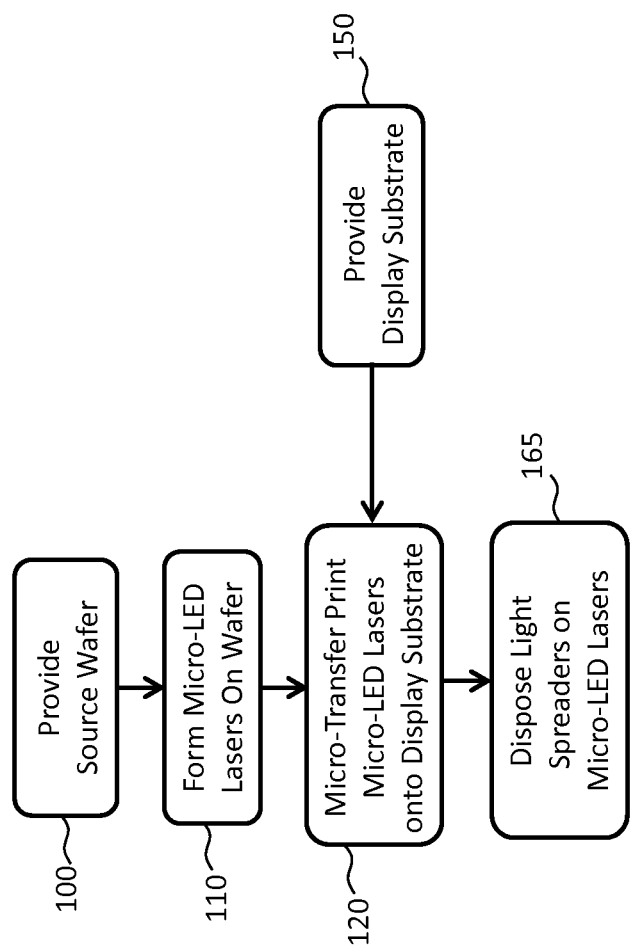

Referring to FIG. 21 in an alternative method of the present invention, the source wafer 20 is provided in step 100 and the micro-LED lasers 40 are formed on the source wafer 20 in step 110 and micro-transfer printed onto the display substrate 22 in step 120. The display substrate 22 is provided in step 150. However, instead of disposing the light spreaders 30 on the display substrate 22 in step 160 as in FIG. 20, the light spreaders 30 are disposed on the micro-LED lasers 40 in step 165, for example by patterning a light-diffusive layer 36 over the micro-LED lasers 40, by laminating or micro-lithographically forming a lenslet array 38 over the micro-LED lasers 40, or by forming a micro-transfer printable light spreader 30 and micro-transfer printing the light spreader 30 onto the micro-LED lasers 40, for example as shown in FIGS. 16-19.

Figure 22:
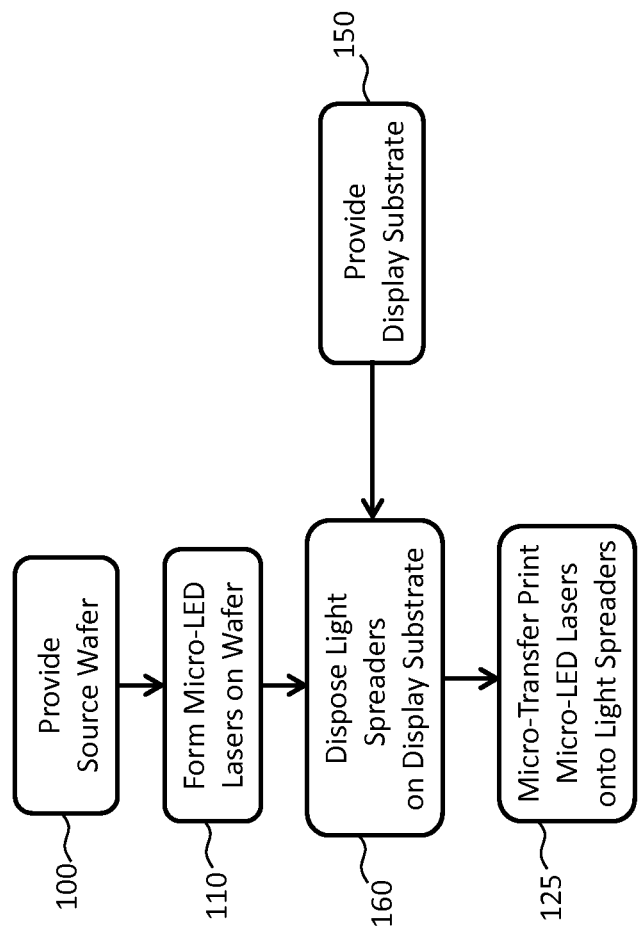

Referring to FIG. 22 in another method of the present invention, the source wafer 20 is provided in step 100 and the micro-LED lasers 40 are formed on the source wafer 20 in step 110. The display substrate 22 is provided in step 150 and the light spreaders 30 disposed on the display substrate 22 in step 160 as in FIG. 20. However, in this embodiment, the micro-LED lasers 40 are disposed on the light spreaders 30 in step 125, for example by patterning a light-diffusive layer 36 over the display substrate 22 and micro-transfer printing the micro-LED lasers 40 onto the light-diffusive layer 36, for example as shown in FIGS. 14-15.

The plurality of micro-transfer printable micro-LED lasers 40 on the source wafer 20 can be formed by providing or designating one or more sacrificial portions 18, for example in a sacrificial layer on or in the source wafer 20, forming the micro-LED lasers 40 on the sacrificial portions 18, and etching the sacrificial portions 18 to provide the micro-transfer printable micro-LED lasers 40. Similarly, a plurality of light spreaders 30 can be formed on the source wafer 20 by providing one or more sacrificial portions 18, for example in a sacrificial layer on or in the source wafer 20, forming the light spreaders 30 on the sacrificial portions 18, for example by coating and then patterning a layer of curable resin including light-diffusive particles, and etching the sacrificial portions 18 to provide the micro-transfer printable light spreaders 30, for example as discussed further with respect to FIG. 25 below. In further embodiments of the present invention, the light spreaders 30 are provided on and micro-transfer printed from the source wafer 20, the light spreaders 30 are provided on the micro-LED lasers 40 forming a pixel structure 60 (as shown in FIG. 5) and the pixel structure 60 is micro-transfer printed from the source wafer 20 to the display substrate 22, or the light spreaders 30 are provided on the source wafer 20 and the micro-LED lasers 40 formed on the light spreaders 30 forming a pixel structure 60 (as shown in FIG. 6) and the pixel structure 60 is micro-transfer printed from the source wafer 20 to the display substrate 22.

Figure 23:
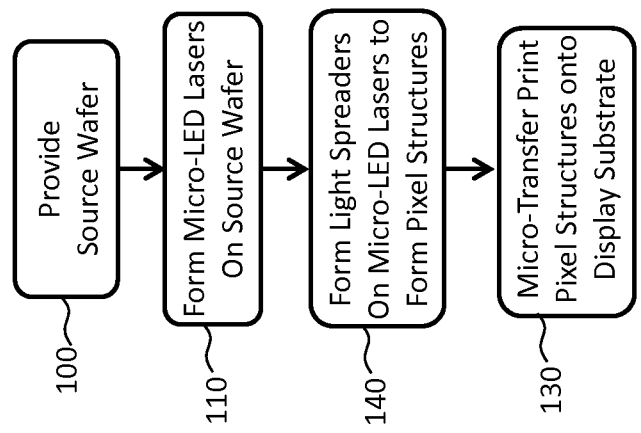

Thus, referring to FIG. 23 in an embodiment of the present invention, the source wafer 20 is provided in step 100 and the micro-LED lasers 40 are formed on the source wafer 20 in step 110. The light spreaders 30 are formed on or applied to, e.g., by lamination or micro-transfer printing the light spreaders 30 from another different source wafer 20, the micro-LED lasers 40 to form the pixel structures 60 in step 140. The pixel structures 60 are then micro-transfer printed onto the display substrate 22 in step 130 to provide a micro-LED laser display 10.

Figure 24:
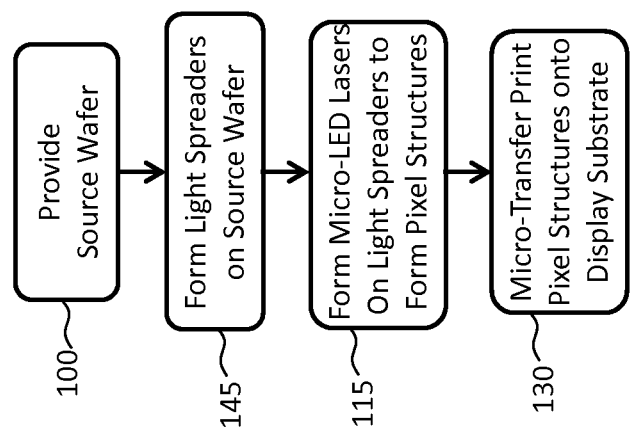

Alternatively, referring to FIG. 24 in an alternative embodiment of the present invention, the source wafer 20 is provided in step 100 and the light spreaders 30 are formed on the source wafer 20 in step 145. The micro-LED lasers 40 are formed on or applied to, e.g. by micro-transfer printing the micro-LED lasers 40 from another different source wafer 20, to form the pixel structures 60 in step 115. The pixel structures 60 are then micro-transfer printed onto the display substrate 22 in step 130 to provide a micro-LED laser display 10.

In the embodiments in which the light spreaders 30 are refractive lenses 34, the lenslets can be formed in correspondence with each micro-LED laser 40 using photolithography, using a mold, or using micro-lithography. The refractive lenses 34 can be formed on the source wafer 20, on the micro-LED lasers 40 on the source wafer 20, or on the display substrate 22, depending on the desired micro-LED laser display 10 configuration.

Figure 25:
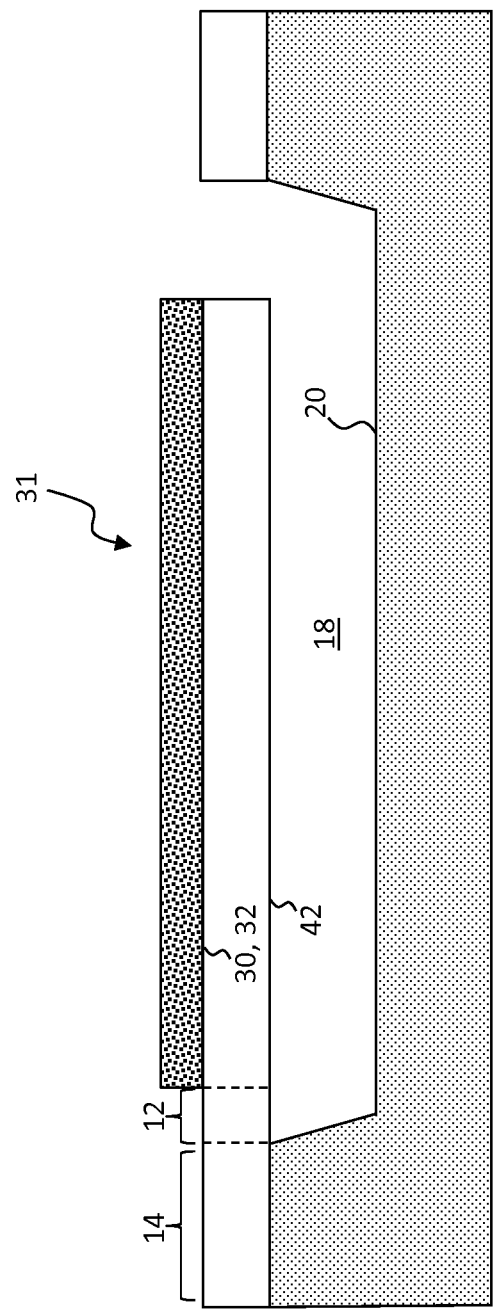
FIG. 25 is a cross section of a micro-transfer printable light spreader according to an embodiment of the present invention.

Thus, according to an embodiment of the present invention and as illustrated in FIG. 25, a micro-transfer printable light spreader 31 comprises a light-spreading article, for example a light spreader 30 such as a light diffuser 32 or a refractive lens 34 (not shown) formed on a dielectric layer 42 over a sacrificial portion 18 of a source substrate 20 and at least a portion of a tether 12 connected to the light-spreading article that extends from the light-spreading article. Alternatively, the dielectric layer 42 can be the light diffuser 32 or a light-diffusive layer 36 (not shown). The tether 12 is physically connected to an anchor 14 and the source substrate 20. The sacrificial portion 18 can be etched to form cavity and release the micro-transfer printable light spreader 30 from the source substrate 20 so that the micro-transfer printable light spreader 30 can be micro-transfer printed. The light-spreading article can include a light diffuser 32 (as shown in FIG. 25) or a refractive lens 34 (not shown in FIG. 25) and the source substrate 20 can have a plurality of sacrificial portions 18, each having a light-spreading article disposed thereon.

At least a portion of a tether 12 is connected to a micro-transfer printable structure (e.g., a micro-LED laser 40, light spreader 30, or pixel structure 60) and extends or protrudes from the micro-transfer printable structure, for example from a periphery, edge or side of the micro-transfer printable structure, and can be attached with the tether 12 to an anchor 14 of the source substrate 20 (e.g., a native substrate on which the micro-transfer printable structure is formed). The anchor 14 can be a portion of the source substrate 20 to which a tether 12 is attached. In one configuration, the source substrate 20 has one or more sacrificial portions 18 and the micro-transfer printable structure is disposed or formed on or over each sacrificial portion 18 of the source substrate 20. The sacrificial portion 18 can be a designated area or portion of the source substrate 20, a sacrificial material layer, a portion of a sacrificial material layer, a patterned sacrificial material layer, or a cavity under the micro-transfer printable structure, for example formed by removing a portion or all of the material in a sacrificial layer portion 18. As shown in FIGS. 2-5 and 25, the sacrificial portion 18 can be a cavity above which the micro-transfer printable structure is suspended by the tether 12 affixed to the anchor 14 so that the tether 12 extends from a periphery of the sacrificial portion 18 (at an anchor 14) to a periphery of the micro-transfer printable structure. According to an embodiment of the present invention, the micro-transfer printable structure is micro-transfer printed.

The source substrate 20 can be a semiconductor source substrate 20, for example silicon such as silicon (1 0 0) or silicon (1 1 1), glass, plastic, or other materials suitable for wafers. Sacrificial layers or sacrificial portions 18 can include layers or patterned layers of etchable materials, for example such as oxides or nitrides such as silicon oxide or silicon nitride, or portions of the source substrate 20 that are differentially etchable in different directions (for example by taking advantage of the crystalline structure of the source substrate 20 to etch in one direction more rapidly than in another direction).

The patterned light diffusers 32, as shown in FIGS. 2 and 3, can be formed by photolithographically processing a blanket-coated layer of light-diffusive particles in a photo-curable matrix, such as a photoresist, exposing the blanket-coated layer to patterned electro-magnetic radiation (e.g., ultra-violet light through a patterned mask), and then developing the pattern-wise exposed coating.

According to a further embodiment of the present invention, the source substrate 20 has one or more sacrificial portions 18, for example forming an array of sacrificial portions 18 over, on, or in the source substrate 20. Each sacrificial portion 18 has a micro-transfer printable structure disposed on or over each of the sacrificial portions 18. In each case, a tether 12 extends from an anchor 14 (e.g., from a periphery of the sacrificial portion 18) to a periphery of the micro-transfer printable structure to connect the micro-transfer printable structure to the source substrate 20. The array of micro-transfer printable structure can be micro-transfer printed from the source substrate 20 to a destination substrate 22 (e.g., a display substrate 22) as is described, for example, in U.S. patent application Ser. No. 14/743,981, filed Jun. 18, 2015, entitled Micro Assembled LED Displays and Lighting Elements, which is hereby incorporated by reference in its entirety. In various methods of the present invention, the pixel structures 60, micro-LED lasers 40, or light spreaders 30 are micro-transfer printed to a display substrate 22. For a discussion of micro-transfer printing techniques see, U.S. Pat. Nos. 8,722,458, 7,622,367 and 8,506,867, each of which is hereby incorporated by reference.

In another method of the present invention, the pixel structures 60 are disposed on the display substrate 22 by micro-transfer printing using compound micro assembly structures and methods, for example as described in U.S. patent application Ser. No. 14/822,868, filed Aug. 10, 2015, entitled *Compound Micro-Assembly Strategies and Devices*, which is hereby incorporated by reference in its entirety. The micro-LED lasers 40 on the display substrate 22 can be interconnected using photolithographic methods or using printed circuit board methods and materials, for example to a display controller 80.

In useful embodiments the display substrate 22 includes material, for example glass or plastic, different from a material in an integrated-circuit or chiplet substrate, for example a semiconductor material such as silicon. The display substrate 22 usefully has two opposing smooth sides suitable for material deposition, photolithographic processing, or micro-transfer printing of color-conversion structures 10. The display substrate 22 can have the size of a conventional display, for example a rectangle with a diagonal of a few centimeters to one, two, five or ten or more meters. Such substrates are commercially available. The display substrate 22 can include polymer, plastic, resin, polyimide, PEN, PET, metal, metal foil, glass, a semiconductor, or sapphire and have a transparency greater than or equal to 50%, 80%, 90%, or 95% for visible light. In some embodiments of the present invention, the micro-LED lasers 40 emit light through the display substrate 22. In other embodiments, the micro-LED lasers 40 emit light in a direction opposite the display substrate 22. The display substrate 22 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. According to embodiments of the present invention, the display substrate 22 can include layers formed on an underlying structure or substrate, for example a rigid or flexible glass or plastic substrate.

According to various embodiments, the micro-transfer-printed micro-LED laser displays 10 of the present invention include a variety of designs having a variety of resolutions, micro-LED laser 40 sizes, light spreader 30 sizes, and display substrates 22 having a range of display areas. For example, display areas ranging from 1 cm by 1 cm to 5 m by 10 m in size are contemplated. The resolution of display pixels 62 over a display area can also vary, for example from tens of display pixels 62 per inch to hundreds of display pixels 62 per inch. Thus, the present invention has application in both low-resolution and very high-resolution displays and in both very small and very large displays.

In an embodiment, the micro-LED lasers 40 are formed in substrates or on supports separate from the display substrate 22. For example, the light spreaders 30 or micro-LED lasers 40 are separately formed in a semiconductor source wafer 20. The light spreaders 30 or micro-LED lasers 40 are then removed from the source wafer 20 and transferred, for example using micro-transfer printing, to the display substrate 22 or to a compound micro-assembly substrate (not shown).

By employing a multi-step transfer or assembly process, intermediate testing is enabled, increased yields are achieved, and costs are reduced for the micro-transfer-printed micro-LED laser displays 10 of the present invention.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a sacrificial layer or sacrificial portion 18 is considered "on" a substrate when a layer of sacrificial material or sacrificial portion 18 is on top of the substrate, when a portion of the substrate itself is the sacrificial layer, or when the sacrificial layer or sacrificial portion 18 comprises material on top of the substrate and a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 micro-LED laser display
12 tether
14 anchor
18 sacrificial portion
20 substrate/source substrate/source wafer
22 destination substrate/display substrate
30 light spreader
31 micro-transfer printable light spreader
32 light diffuser
34 refractive lens/lenslet
36 light-diffusive layer/light diffuser
38 lenslet array
40 micro-LED laser
40R red micro-LED laser
40G green micro-LED laser
40B blue micro-LED laser
42 dielectric layer
43 light-emission side
46 first electrode
48 second electrode
50 substantially collimated micro-LED laser light
50R red micro-LED laser light
50G green micro-LED laser light
50B blue micro-LED laser light
52 spread light
54 light absorber
56 light reflector
60 pixel structure
62 display pixel
64 array of display pixels
80 controller/display controller
82 buss
100 provide source wafer step
110 form micro-LED lasers on wafer step
115 form micro-LED lasers on light spreader step
120 micro-transfer print micro-LED lasers onto display substrate step
125 micro-transfer print micro-LED lasers onto light spreaders step
130 micro-transfer print pixel structures onto display substrate step
140 form light spreaders on micro-LED lasers step
145 form light spreaders on source wafer step
150 provide display substrate step
160 dispose light spreaders on display substrate step
165 dispose light spreaders on micro-LED lasers step

What is claimed:

1. A micro-LED laser display comprising an array of display pixels, comprising:
a display substrate;
an array of display pixels, each of the display pixels comprising one or more micro-LED lasers disposed on the display substrate, each of the one or more micro-LED lasers emitting light within an emission angle, wherein each of the one or more micro-LED lasers has at least one of a length and a width from 2 to 50 µm;
a separate and individual light spreader provided in correspondence with each of the one or more micro-LED lasers for increasing the emission angle of light emitted by each of the one or more micro-LED lasers in the array of display pixels, wherein the separate and individual light spreader is disposed on only one of the one or more micro-LED lasers and exclusively directly above or below and in contact with the only one of the one or more micro-LED lasers; and
a controller for individually controlling each of the one or more micro-LED lasers in the array of display pixels, wherein the micro-LED lasers are non-native to the display substrate.

2. The display of claim 1, wherein the separate and individual light spreader is a light diffuser disposed to diffuse light emitted by the only one of the one or more micro-LED lasers.

3. The display of claim 1, wherein the separate and individual light spreader is a refractive lens disposed to refract light emitted from the only one of the one or more micro-LED lasers.

4. The display of claim 1, wherein each of the one or more micro-LED lasers in the array of display pixels emits light of a same color.

5. The display of claim 1, wherein the display comprises a first array of first micro-LED lasers that emit light of a first color and a second array of second micro-LED lasers that emit light of a second color, wherein the second color is different from the first color.

6. The display of claim 1, wherein:
the separate and individual light spreader is disposed only between the only one of the one or more micro-LED lasers and the display substrate
and on the display substrate.

7. The display of claim 1, comprising light reflectors or light absorbers disposed between the display pixels in the array of display pixels along a surface of the display substrate.

8. The display of claim 1, wherein the separate and individual light spreader comprise at least one of a phosphorescent or fluorescent material, light-refractive particles, and light-reflective particles.

9. The display of claim 5, wherein the second micro-LED lasers are spatially interdigitated between the first micro-LED lasers.

10. The display of claim 5, comprising a third array of third micro-LED lasers that emit light of a third color, wherein the third color is different from the first color and the second color.

11. The display of claim 10, wherein the third micro-LED lasers are spatially interdigitated between the first micro-LED lasers and the second micro-LED lasers.

12. The display of claim 1, wherein each of the one or more individual light spreaders comprises at least at least a portion of a tether connected to the light-spreader that extends from the light-spreader.

13. The display of claim 1, wherein each display pixel comprises a dielectric layer on which the one or more micro-LED lasers and the one or more light spreaders are disposed, wherein the dielectric layer comprises at least a portion of a tether.

14. The display of claim 7, wherein the light reflectors or light absorbers are disposed over at least a portion of the one or more individual light spreaders.

15. The display of claim 1, wherein the separate and individual light spreader has an area that is less than or equal to an area of the only one of the one or more micro-LED lasers.

16. The display of claim 2, wherein the only one or more micro-LED lasers is disposed only between the separate and individual light spreader and the display substrate.

17. The display of claim 1, wherein the separate and individual light spreader is disposed in direct contact with the only one of the one or more micro-LED lasers.

18. The display of claim 1, wherein the only one or more micro-LED lasers is disposed only between the separate and individual light spreader and the display substrate.

19. A method of making a micro-LED laser display, comprising:
providing a source wafer and a display substrate for displaying an image thereon;
forming a plurality of micro-transfer printable micro-LED lasers on the source wafer;
disposing a corresponding separate and individual light spreader on each of the micro-LED lasers on the source wafer, wherein each corresponding separate and individual light spreader is disposed on only one of the micro-LED lasers and exclusively directly above or below the only one of the one or more micro-LED lasers;
micro-transfer printing each micro-LED laser of the plurality of micro-LED lasers, together with the corresponding separate and individual light spreader, from the source wafer onto the display substrate to provide an array of display pixels, each of the display pixels comprising one or more of the micro-LED lasers disposed on the display substrate, each of the one or more of the micro-LED lasers emitting light within an emission angle, wherein each of the micro-LED lasers has at least one of a length and a width from 2 to 50 µm; and
disposing a controller for individually controlling each of the micro-LED lasers in the array of display pixels.

20. The method of claim 19, wherein, for each of the micro-LED lasers on the source wafer, disposing the separate and individual light spreader on the micro-LED laser comprises:
providing a dielectric layer; and
disposing the separate and individual light spreader on the dielectric layer prior to forming the micro-LED laser.

21. The method of claim 19, wherein, for each of the micro-LED lasers on the source wafer, disposing the separate and individual light spreader on the micro-LED laser comprises:
disposing the separate and individual light spreader on the micro-LED after forming the micro-LED laser on a dielectric layer.

22. The method of claim 19, wherein micro-transfer printing each micro-LED laser of the plurality of micro-LED lasers from the source wafer onto the display substrate to provide an array of display pixels comprises micro-transfer printing a plurality of pixel structures, wherein the plurality of pixel structures comprise the plurality of micro-LED lasers and the separate and individual light spread on each of the micro-LED lasers.

* * * * *